United States Patent
Shizuno

(10) Patent No.: US 7,227,243 B2
(45) Date of Patent: Jun. 5, 2007

(54) SEMICONDUCTOR DEVICE

(75) Inventor: Yoshinori Shizuno, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 44 days.

(21) Appl. No.: 11/081,635

(22) Filed: Mar. 17, 2005

(65) Prior Publication Data

US 2005/0161788 A1    Jul. 28, 2005

Related U.S. Application Data

(62) Division of application No. 10/697,156, filed on Oct. 31, 2003, now Pat. No. 6,888,222.

(30) Foreign Application Priority Data

Nov. 8, 2002    (JP)    ............................ 2002/325768

(51) Int. Cl.
| | |
|---|---|
| H01L 23/544 | (2006.01) |
| H01L 29/06 | (2006.01) |
| H01L 23/48 | (2006.01) |
| H01L 23/04 | (2006.01) |

(52) U.S. Cl. ...................... 257/619; 257/618; 257/730; 257/737; 257/787; 257/E23.021

(58) Field of Classification Search ........ 257/618–620, 257/737, 780, 730, 787
See application file for complete search history.

(56) References Cited

U.S. PATENT DOCUMENTS

| | | | | |
|---|---|---|---|---|
| 5,355,283 | A | * | 10/1994 | Marrs et al. ................. 361/760 |
| 5,581,109 | A | * | 12/1996 | Hayashi et al. ............. 257/503 |
| 5,716,759 | A | | 2/1998 | Badehi |
| 6,034,422 | A | * | 3/2000 | Horita et al. ................ 257/677 |
| 6,040,235 | A | | 3/2000 | Badehi |
| 6,268,648 | B1 | | 7/2001 | Fukutomi et al. |
| 6,455,920 | B2 | | 9/2002 | Fukasawa et al. |
| 7,029,953 | B2 | | 4/2006 | Sasaki |

FOREIGN PATENT DOCUMENTS

JP    61-113252    5/1986

(Continued)

*Primary Examiner*—Nitin Parekh
(74) *Attorney, Agent, or Firm*—Rabin & Berdo, PC

(57) ABSTRACT

An object of the present invention is to provide a semiconductor device capable of adapting to an increase in the external terminals which can be arranged on the mount surface (a greater number of pins). A mesa-type semiconductor chip is mounted on a mount surface of a substrate which is a semiconductor chip carrying portion such that the side wall surface of the four side walls of the first semiconductor chip intersects the mount surface at an acute angle θ (0°<θ<90°). Further, a first pad formed on a main surface of the first semiconductor chip is electrically connected to a solder ball provided on an unmounted surface, via a first wiring layer, one end of which is connected to the first pad, and which extends along the main surface, the side wall surface, and the unmounted surface of the semiconductor chip.

14 Claims, 12 Drawing Sheets

FOREIGN PATENT DOCUMENTS

| | | |
|---|---|---|
| JP | 04-350951 | 12/1992 |
| JP | 05-175648 | 7/1993 |
| JP | 11251493 A | 9/1999 |
| JP | 2001094041 A | 4/2001 |
| JP | 2001156250 A | 6/2001 |
| JP | 2001189413 A | 7/2001 |
| JP | 2001-189413 A * | 10/2001 |
| JP | 2001358997 | 12/2001 |
| JP | 2002-158312 | 5/2002 |
| WO | WO 99/40624 | 8/1999 |

* cited by examiner

SEMICONDUCTOR DEVICE

This is a Divisional of U.S. application Ser. No. 10/697,156, filed Oct. 31, 2003 now U.S. Pat. No. 6,888,222, the subject matter of which is incorporated herein by reference.

BACKGROUND OF THE INVENTION

1. Field of the Invention

The present invention relates to a semiconductor device with a package structure.

2. Description of Related Art

Recent years have witnessed an ever-increasing demand for miniaturization and an increase in the density of semiconductor devices that are mounted in electronic devices such as portable devices, as well as for higher frequency transmission signals. Accordingly, CSPs (Chip Size Packages) which are semiconductor devices packaged such that the external size thereof is substantially the same as the external size of the semiconductor chip have been attracting attention.

With a view to reducing fabrication costs and so forth, recent years have more particularly seen the active development of WCSP (Wafer-level Chip Size Package) technology (for example, Nikkei Microdevices, February 1999 Edition, pages 48 to 56, FIGS. 1 and 4), which are CSPs produced by means of completion as far as the external terminal formation step of a wafer not subjected to further processing, followed by the creation of individual packages by means of dicing and so forth.

Such WCSPs have a structure in which external terminals, and electrode pads on the semiconductor chip, are electrically connected via a wiring layer in which the external terminals are rearranged in desired positions. The wiring layer is formed by patterning and is also called the 're-distribution wiring layer' or 'wiring pattern'.

WCSPs, which comprise this re-distribution wiring layer, afford the benefit of permitting increased freedom in the wiring design as a result of this re-distribution wiring layer.

On the other hand, for the purpose of implementing high density mounting, recent years have seen the application of MCPs (Multi Chip Packages) in which a plurality of chips are arranged in planar fashion or stacked in the thickness direction of the semiconductor chips within a single package (for example, Nikkei Microdevices, February 2000 Edition, pages 50 to 52, FIG. 1).

Furthermore, as a structure that raises the mount density still further, package stacked-type MCPs in which a plurality of packages are stacked in the thickness direction of the semiconductor chips are currently being proposed.

However, because the WCSPs that comprise the re-distribution wiring layer described above are packages whose outer dimensions are substantially the same as the outer dimensions of the semiconductor chip as described earlier, there are limits on the number of external terminals that can be arranged on the mount surface.

Stated in more detail, because current WCSPs have a fan-in structure, that is, a structure in which the external terminals are arranged above the semiconductor chip, the maximum number of external terminals that can be arranged is as many as about 160 (pins), and the minimum interval (pitch) between the external terminals is then about 0.5 mm.

In order to meet the demand for a greater number of pins in accordance with the higher integration of recent years, it is sometimes necessary to narrow the minimum interval between external terminals to about 0.4 mm, for example.

However, although setting the interval between external terminals at about 0.4 mm is technically feasible, such a practice is undesirable due to the requirement for a high density mounting technology during the mounting on the mount substrate.

Furthermore, in the case of a multiple pin class of about 300 pins, however narrow the external terminal interval may be, it is sometimes difficult to arrange the pins on the mount substrate.

Therefore, BGA (Ball Grid Array)-type and LGA (Land Grid Array)-type packages that adopt a wire bonding (sometimes referred to simply as 'WB' hereinafter) method have been proposed, these being packages in which a semiconductor chip is mounted on a wiring substrate and having a structure that allows external terminals to be arranged over the whole of the reverse side of the package.

However, since the inductance of the WB parts is high in the case of such structures in which the wire bonding method is normally adopted, impedance matching with the circuit in the semiconductor chip is problematic. Furthermore, because a wiring substrate such as one comprising bonding pads is required, not only does this lead to a thick package, fabrication costs are also increased.

Meanwhile, the flip chip method has been proposed as a wireless bonding method. However, because the interval between pads (electrode pads) on the semiconductor chip is then equal to or less than 0.1 mm, an expensive build-up substrate is required, and the flip bonding processing takes a long time. Hence such a method is not suited to mass production.

Further, also with the above-described MCPs, in the case of a structure that adopts the WB method, problems include increased inductance and an increase in the package external form and package thickness, and so forth, which are caused by the WB, as described earlier.

Moreover, even with the above-described package stacked-type MCPs, in the case of a structure that adopts the WB method, not only are there problems that include increased inductance and an increase in the package external form and package thickness, and so forth, which are caused by the WB, as described earlier, an increase in the number of pins of the MCP is also unsuitable because the MCP cannot be afforded a fan-in structure.

Accordingly, it is an object of the invention to provide a semiconductor device whereby, on the basis of a WCSP structure for which a still wider application range is sought in the future, an increase in the number of pins through an enlargement of the mount surface can be implemented, greater miniaturization than the prior art (miniaturization of the package size and thinner films) is achieved and an MCP and a package stacked-type MCP and the like can be designed.

SUMMARY OF THE INVENTION

Therefore, the semiconductor device of the present invention has characteristics based on the following constitution.

In other words, the semiconductor device of the present invention comprises a first semiconductor chip that includes: a first main surface that has a first pad; a second main surface which is opposite to the first main surface and whose surface area is larger than that of the first main surface; and a side wall surface that connects between the first main surface and the second main surface. Further, the first semiconductor chip is mounted on a first region of a semiconductor chip carrying portion that includes a third main surface having a first region and a second region that surrounds the first region, and a fourth main surface which is opposite to the third main surface. Also, a first wiring layer is formed which is electrically connected to the first pad and which extends from the first pad, along the first main surface and an inclined side wall surface, to above the second region. Also, an external terminal, which is electrically connected to the first pad via the first wiring layer, is formed over the second region.

A method for manufacturing of the semiconductor device of the present invention comprises:

forming the side wall surface that connects between the first main surface having the first pad and the second main surface which is located on the reverse side of the first main surface and whose surface area is larger than that of the first main surface, over the first semiconductor chip;

mounting the first semiconductor chip on the first region of the semiconductor chip carrying portion that includes the third main surface having the first region and the second region, that surrounds the first region, and the fourth main surface which is located on the reverse side of the third main surface;

forming the first wiring layer which is electrically connected to the first pad and which extends from the first pad to above the second region along the first main surface and an inclined side wall surface; and forming the external terminal which is electrically connected to the first pad via the first wiring layer, over the second region.

According to this constitution, because an external terminal can be arranged, not only above the first semiconductor chip (that is, the fan-in portion), but also in a region other than above the first semiconductor chip (that is, the fan-out portion), a semiconductor device which is more capable of adapting to an increase in the number of pins than an ordinary WCSP is produced.

In addition, in this constitution, because the electrode pads on the semiconductor chip and the external terminals are electrically connected via a wiring layer, a reduction in the total signal wiring length and so forth in comparison with the WB method is feasible, and, accordingly, a semiconductor device with superior high frequency characteristics is produced.

Further, another semiconductor device of the present invention comprises a first semiconductor chip that includes: a first main surface that has a first pad; a second main surface which is opposite to the first main surface and whose surface area is larger than that of the first main surface; and a side wall surface that connects between the first main surface and the second main surface, wherein the first semiconductor chip is formed with an inclined side wall surface which is produced by chamfering a ridge portion between the first main surface and the side wall surface. Further, another semiconductor device comprises a frame-shape portion that includes a third main surface and a fourth main surface that is opposite to the third main surface, wherein the frame-shape portion surrounds the first semiconductor chip so as to expose at least a surface region of the inclined side wall surface on the first main surface side. Also, a first wiring layer is formed which is electrically connected to the first pad and which extends from the first pad, along the first main surface and the inclined side wall surface, to above the third main surface of the frame-shape portion. Also, an external terminal, which is electrically connected to the first pad via the first wiring layer, is formed over the third main surface.

A method for manufacturing of another semiconductor device of the present invention comprises:

forming the inclined side wall surface which is produced by chamfering the ridge portion between the first main surface having the first pad and the side wall surface that connects between the first main surface and the second main surface which is located on the reverse side of the first main surface and whose surface area is larger than that of the first main surface, over the first semiconductor chip;

forming the frame-shape portion that includes the third main surface and the fourth main surface that is opposite to the third main surface, wherein the frame-shape portion includes an opening for surrounding the first semiconductor chip so as to expose at least the surface region of the inclined side wall surface on the first main surface side, over a support section for supporting the first semiconductor chip;

mounting the first semiconductor chip into the opening of the support section;

forming the first wiring layer which is electrically connected to the first pad and which extends from the first pad, along the first main surface and the inclined side wall surface, to above the third main surface of the frame-shape portion;

forming the external terminal which is electrically connected to the first pad via the first wiring layer, over the third main surface.

The step of forming the frame-shape portion is performed by hardening a photosensitive resin, after patterning the photosensitive resin.

Also, the step of mounting the first semiconductor chip into the opening of the support section is performed between the step of patterning the photosensitive resin and the step of hardening a photosensitive resin.

Also, a method for manufacturing of another semiconductor device of the present invention comprises the step of removing the support section after mounting the first semiconductor chip into the opening of the support section.

According to this constitution, in addition to being a structure that permits the above-described increase in pins, part of the side wall of the first semiconductor chip may be an inclined wall and may be exposed via the frame-shape portion. Hence, in the side wall, the wall other than the exposed inclined wall can be a vertical wall (vertical end wall), for example, whereby miniaturization of the size of the first semiconductor chip is feasible.

Accordingly, the cumulative number of chips per wafer can be improved, whereby an increase in fabrication costs can be suppressed.

BRIEF DESCRIPTION OF THE DRAWINGS

The foregoings and other objects, features and advantages of the present invention will be better understood from the following description taken in connection with the accompanying drawings, in which.

DESCRIPTION OF THE PREFERRED EMBODIMENTS

Figure 1A:
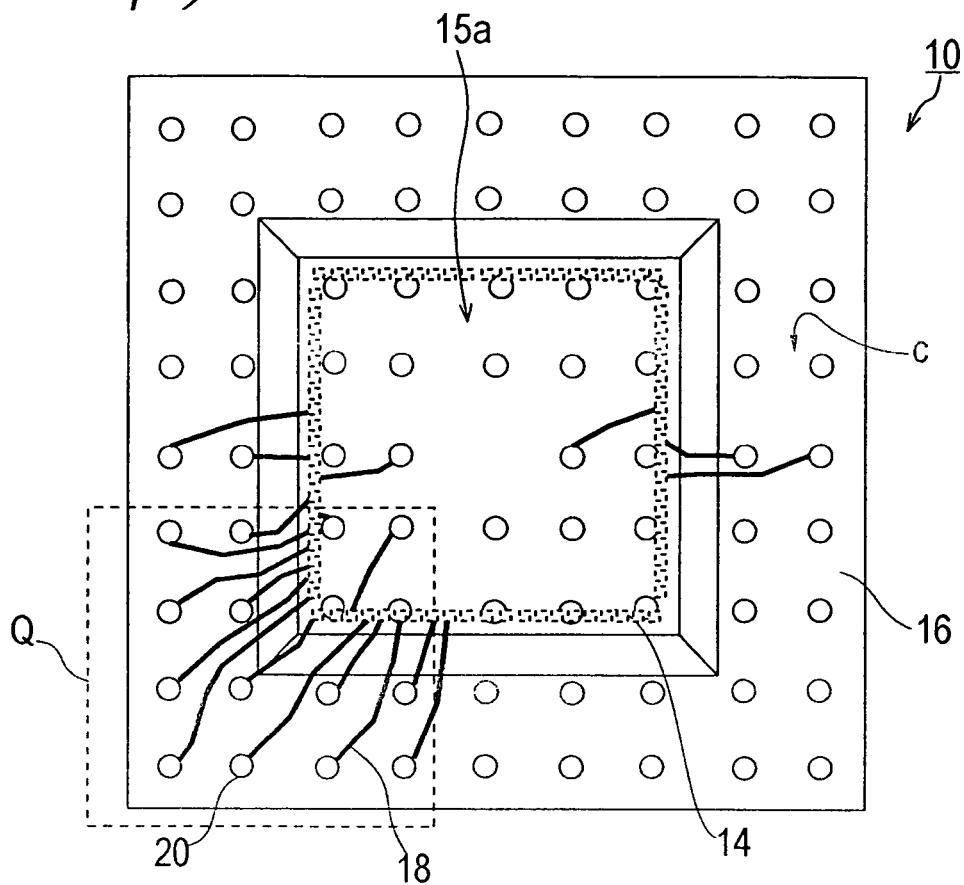
FIG. 1(A) shows an outline planar view of a semiconductor device according to a first embodiment of the present invention.

Embodiments of the invention will be described below with reference to FIGS. 1 to 13. The drawings provide an outline view of a constitutional example of the semiconductor device according to the present invention. Further, the drawings merely provide an outline view of the shape, size and dispositional relationship of the constitutional components to an extent permitting an understanding of the invention, there being no intention to limit the invention to the illustrated examples. Further, in order to simply understanding of the drawings, hatching (slanted lines) denoting a cross-section is omitted except in parts. Further, in the following description, although specific materials and conditions and so forth are sometimes employed, these materials and conditions constitute no more than one preferred example, and hence the present invention is in no way limited to or by such an example. Further, the same numerals are shown allocated to the same constitutional components in the drawings so that repetitive description is also omitted. Furthermore, in the following description, although the planar shape of the semiconductor chip and of the semiconductor chip carrying portion is described as being square, this shape could also be an optional preferred shape in accordance with the design.

First Embodiment

Figure 1B:
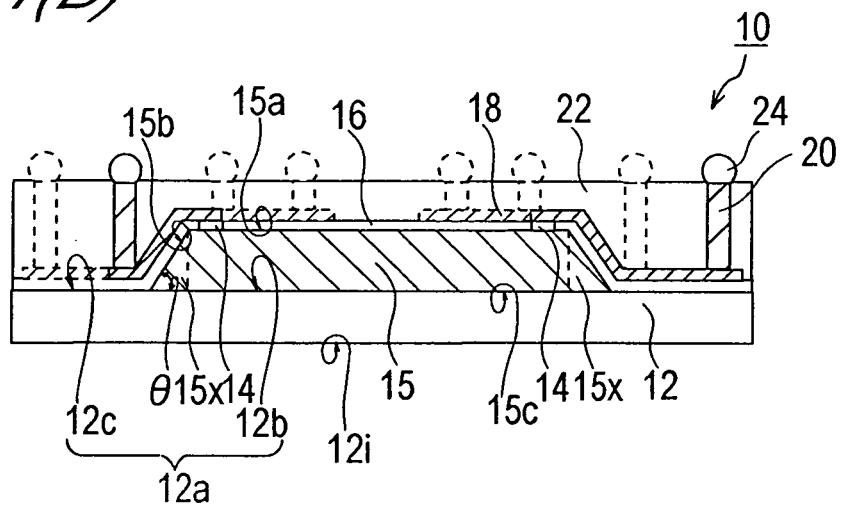
FIG. 1(B) is an outline cross-sectional view of part of the semiconductor device according to the first embodiment of the present invention.

A description will now be provided for the semiconductor device and fabrication method thereof according to the first embodiment of the invention, with reference to FIGS. 1 to 3. FIG. 1(A) is an outline planar view of a semiconductor device 10 of this embodiment. Further, although FIG. 1(B) does not correspond with FIG. 1(A), FIG. 1(B) is a cross-sectional view in which, in order to describe the appearance of the connection between and disposition of the constituent elements of the semiconductor device 10, the connection between and disposition of these elements are modified and shown in outline. Further, in FIG. 1(A), there is no illustration of the external terminals and so forth formed on the post portions 20, and, with the exception of a region Q in this figure, the overview of part of first pads 14, a first wiring layer 18 and the post portions 20 does not include such an illustration (as is also the case for the embodiments below).

As shown in FIG. 1(A), the first pads (electrode pads) 14 that comprise aluminum (Al) are disposed at predetermined intervals along the outer perimeter of a first semiconductor chip 15 on a main surface 15a which constitutes the first main surface of the first semiconductor chip 15 which the semiconductor device 10 comprises. Further, in the example shown in FIG. 1(A) because the planar shape of the first semiconductor chip 15 is a square, the first pads 14 are arranged linearly along the edges of this square. Also, the first electrode pads 14 and the post portions 20 comprising copper (Cu) which correspond with the first electrode pads 14 are electrically connected via the first wiring layer 18 that comprises copper (the details will be provided subsequently). Further, the placement quantity of the first pads 14 and the positions thereof are not restricted to those shown in FIG. 1(A), it being possible to implement an optional preferred arrangement in accordance with the design (as is also the case for the embodiments below).

As is shown in FIG. 1(B), the first semiconductor chip 15, whose outer dimensions are smaller than those of a mount surface 12a, is mounted on and fixed to the mount surface 12a which constitutes the third main surface of the semiconductor chip carrying portion 12. In this constitution example, a substrate 12 is used as the semiconductor chip carrying portion. Also, the first semiconductor chip 15 is actually mounted within the mount surface 12a which is the third main surface, that is, a first regional part that faces a second main surface 15c which is the reverse side of the first main surface 15a is the mount surface 12b.

The four side walls 15x of the first semiconductor chip 15 are inclined walls. The side wall surfaces (inclined side wall surfaces) 15b of these inclined walls intersect the mount surface 12b at an acute angle θ (0°<θ<90°). Also, although, in this constitutional example, the side walls 15x each comprise one inclined side wall surface 15b, the constitution may be different. In other words, so long as patterning of the wiring layer can be carried out by sputtering or similar, one side wall may be constituted formed with a level difference resulting from a plurality of levels.

Further, the second main surface 15c, which is the reverse side of the first semiconductor chip 15, and the mount surface 12b, which is the first region, are fixed together (stuck) by means of adhesive (not shown) such as die bonding agent. Also, in the following description, in the mount surface 12a which constitutes the third main surface, a second region, which is a region outside the first region 12b in which the first semiconductor chip 15 is mounted and which surrounds the first region 12b, is called the unmounted surface 12c. Also, irrespective of whether the substrate 12 is a single-sided substrate, a double-sided substrate or a multi-layered substrate, an inorganic material substrate, which may be any of a silicon (Si) substrate, a ceramic substrate and a metal base substrate and the like, or an organic material substrate, which may be either of a glass epoxy substrate and a polyimide substrate and the like, can be employed for the substrate 12, for example. Further, in this constitutional example, the description is provided by citing the substrate 12 as an example of the semiconductor chip carrying portion but the semiconductor chip carrying portion is not restricted to this substrate, any substrate that affords the functions of the semiconductor chip carrying portion being acceptable here. Also, it is desirable not only to increase the cumulative number of chips per wafer but also to secure a margin to avoid chip damage that results from play of the blade or similar during the division to produce individual chips by performing setting such that the angle of intersection between the mount surface 12a and the side wall surfaces 15b is an acute angle θ and the acute angle θ has a value in the range from 45° to 60°.

Furthermore, an insulation film 16, which is produced by sequentially providing a passivation film and a protective film, for example, is provided on the main surface 15a, the side wall surface 15b and the unmounted surface 12c of the first semiconductor chip 15, such that the top surface, for example, of the end portions of the first pads 14 on the main surface 15a of the first semiconductor chip 15 is exposed. Here, the passivation film is formed by a silicon oxidation film ($SiO_2$), for example. Further, the protective film is formed by a film material of low hardness such as polyimide resin, for example, and, accordingly, peeling, which results from the protective film impacting on the first semiconductor chip 15 during the fabrication process and from stress between a sealing layer 22 and the semiconductor chip 15, can be prevented.

Further, the first pads 14 are individually connected electrically via the dedicated first wiring layer 18 to solder balls (bumps) 24 which are external terminals permitting a connection to the mounting substrate.

Therefore, the first wiring layer 18 of this constitutional example is constituted such that the solder balls 24 can be disposed in desired positions on the substantially horizontal surface, that is, in shifted positions above the first semiconductor chip 15, irrespective of the positions of the first pads 14. For this reason, in this constitutional example, the first wiring layer 18 functions as a re-distribution wiring layer that permits the solder balls 24 to be repositioned in positions facing the unmounted surface 12c (the first wiring layer 18 is sometimes referred to as the first re-distribution wiring layer hereinafter).

The first wiring layer 18 of this constitutional example is constituted such that one end thereof is connected to the first pads 14 and so as to extend from the first pads 14 along the top of the side wall surfaces 15b of the inclined walls (side walls) 15x and the unmounted surface 12c of the first semiconductor chip 15 such that the cross-section of this first wiring layer 18 bends in accordance with the vertical interval (step) between the main surface 15a and the unmounted surface 12c of the first semiconductor chip 15. Further, the first wiring layer 18 is electrically connected via the post portions 20 to the solder balls 24 which are allocated as the connection destinations of the first pads 14.

Furthermore, the sealing layer 22, which is formed from epoxy resin or similar, is formed above the main surface 15a, side wall surfaces 15b and the unmounted surface 12c of the first semiconductor chip 15 so as to cover the insulation film 16 and the first wiring layer 18 and the like, and such that the top surface, for example, of the end portions of the post portions 20 are exposed. The upper surface of the sealing layer 22 is a level surface. Further, the solder balls 24, which are bumps used for a connection to a print substrate (not shown) or similar are formed on the post portions 20.

In addition, output signals from the first semiconductor chip 15 of this constitutional example are transmitted to a path that extends from the first pads 14 to the solder balls 24 via the first wiring layer 18 and the post portions 20. Also, input signals from the solder balls 24 are transmitted via a path which is the reverse of the above-mentioned path.

Next, a description will be provided below for the fabrication method of the semiconductor device 10, with reference to FIGS. 2 and 3.

First of all, as far as the side wall surface formation step is concerned, the side wall surfaces 15b for connecting the first main surface 15a and the second main surface 15c are formed on the first semiconductor chip 15 which comprises the first main surface 15a on which the first pads 14 are formed and the second main surface 15c which faces the first main surface 15a and whose surface area is larger than that of the first main surface 15a, whereby a mesa-type first semiconductor chip 15 is obtained.

Figure 2A:
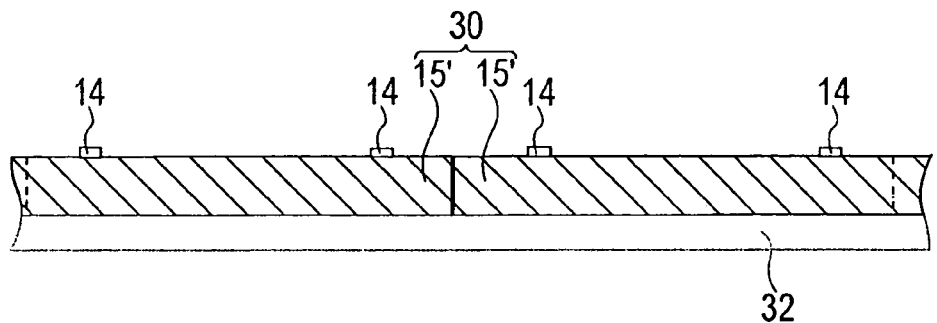
FIGS. 2(A) to 2(C) are outline cross-sectional views that are used to describe the fabrication steps of the semiconductor device according to the first embodiment of the present invention.

Therefore, first, a semiconductor wafer 30, which comprises a plurality of first semiconductor chips 15' (chip size is, for example, with respect to the vertical, approximately 7 mm×approximately 7 mm) prior to division, is prepared. As shown in FIG. 2(A), the first pads 14 are each formed at a predetermined interval (pitch) of 0.035 mm to 0.18 mm, for example, on the main surface of the first semiconductor chip 15' prior to division. The reverse side of this wafer 30 is fixed as a result of being bonded by means of wafer fixing tape 32 coated with adhesive (not shown). Further, although, for the purpose of expediency, approximately two first semiconductor chips 15' prior to division are shown in the figure, the wafer 30 is not limited to two such chips. Further, scribe lines (not shown) on the order of 0.08 mm are formed between the first semiconductor chips 15' prior to division which neighbor each other within the semiconductor wafer 30.

Figure 2B:
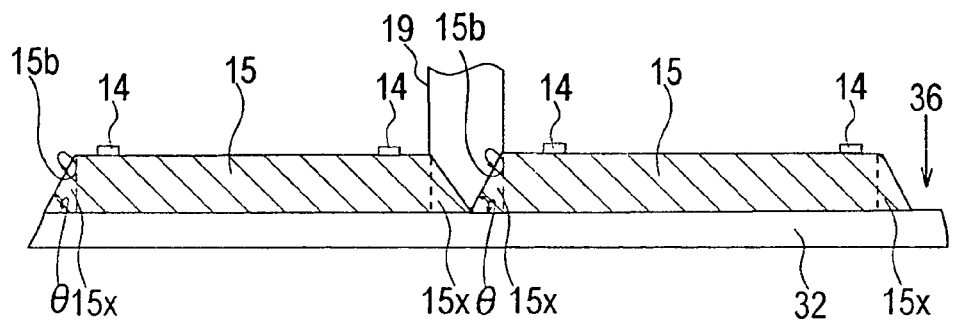

Next, as shown in FIG. 2(B), division, that is, separation, into individual first semiconductor chips 15 is performed along the scribe lines (not shown) by means of a high-speed rotary blade (cutting tool) 19 or similar. The edge of the blade 19 used at such time has an angle (vertical angle) φ (about 60°<θ<90°, for example) such that the cross-sectional shape of the edge is V-shaped. Here, the side wall surfaces 15b, which are inclined at an acute angle θ (0°<θ<90°) to the side walls 15x of the first semiconductor chip 15' are formed in accordance with the formation of a groove 36 which is cut in a V shape. Thereafter, the adhesiveness of the adhesive is lowered by means of UV radiation or similar so as to separate the individual first semiconductor chips 15 from the wafer fixing tape 32.

Next, where the mounting step is concerned, the first semiconductor chip 15 formed with the side walls 15b is mounted on the first region 12b of the semiconductor chip carrying portion 12 that comprises the third main surface 12a, which comprises the first region 12b and the second region 12c that surrounds the first region, and a fourth main surface 12i which is located on the reverse side of the third main surface 12a.

Figure 2C:
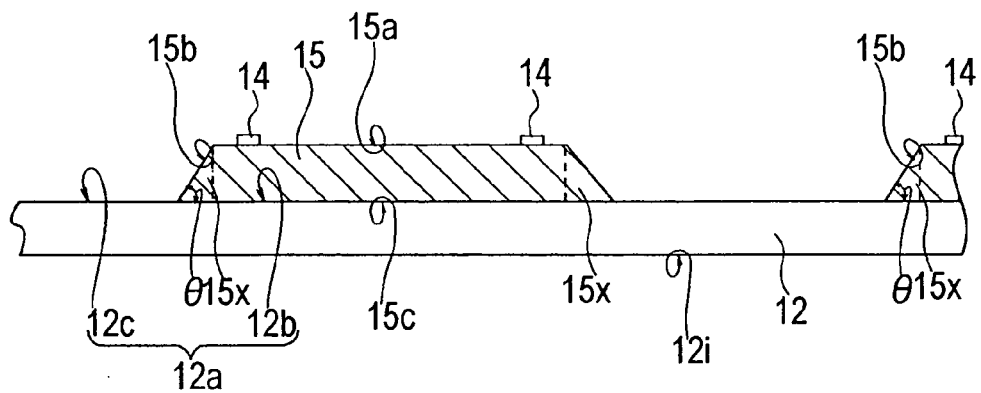

More specifically, as shown in FIG. 2(C), each of the divided first semiconductor chips 15 is mounted at a predetermined interval on the mount surface 12b which is the first region within the mount surface 12a which constitutes the third main surface of the substrate 12. Here, the second main surface 15c, which is the reverse side of the first semiconductor chip 15, and the mount surface 12b are fixed together by means of a die bonding agent (not shown) or similar, for example.

Next, as far as the first wiring layer formation step is concerned, the first wiring layer (first re-distribution wiring layer) 18, which is electrically connected to the first pads 14 and extends from the first pads 14 along the first main surface 15a and the side wall surfaces 15b to above the unmounted surface 12c which is the second region surrounding the first semiconductor chip 15 within the mount surface 12a of the first semiconductor chip 15, is formed.

Figure 3A:
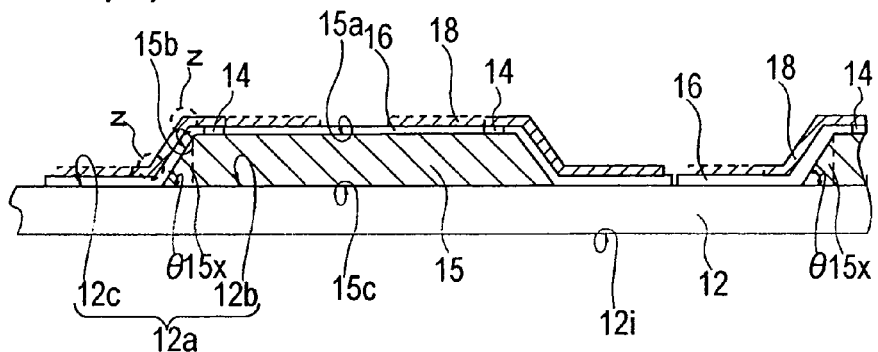
FIGS. 3(A) to 3(C) are outline cross-sectional views that are used to describe the fabrication steps of the semiconductor device according to the first embodiment of the present invention.

Therefore, as shown in FIG. 3(A), first of all, the insulation film 16, which comprises stacked films rendered by sequentially stacking a silicon oxidation film and a polyimide film, is formed so as to extend over the first main surface 15a, the side wall surfaces 15b and the unmounted surface 12c of the first semiconductor chip 15 such that the top surface of the first pads 14 is exposed.

As a result of the presence of the vertical interval (step) between the first main surface 15a and the unmounted surface 12c of the first semiconductor chip 15 which constitute surfaces underlying the insulation film 16, the insulation film 16 is formed so as to correspond with this step.

Next, the first wiring layer 18 comprising copper is formed by patterning by means of photolithography and sputtering and the like so that one end thereof is connected to the first pads 14 and so as to extend from above the insulation film 16 to the unmounted surface 12c via the side wall surfaces 15b of the inclined walls (side walls) 15x such that the cross-section of the first wiring layer 18 bends in accordance with the vertical interval between the above-described first main surface 15a and unmounted surface 12c. Further, because the first wiring layer 18 is formed by patterning, same is also referred to as the first wiring pattern.

Here, the width of the parts of the first wiring layer 18 which are located above the boundary between the first main surface 15a and the side wall surfaces 15b and above the boundary between the side wall surfaces 15b and the unmounted surface 12c (the parts circled by the broken lines z in the figure) respectively, in a direction which is substantially orthogonal to the direction in which the first wiring layer 18 extends (in a direction orthogonal to the page of the illustration) may be formed so as to be thicker than the width of the other (remaining) parts of the first wiring layer.

As a result, the parts of the first wiring layer 18 above these boundaries which are susceptible to impacts and concentrations of stress can be reinforced.

Next, where the external terminal formation step is concerned, external terminals are formed above the unmounted surface 12c so as to be electrically connected to the first pads 14 via the first wiring layer 18.

Figure 3B:
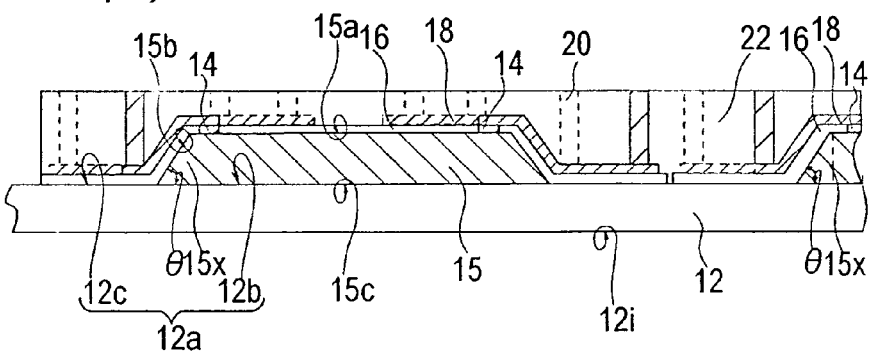

As shown in FIG. 3(B), first of all, corresponding post portions 20 which comprise copper are formed by means of photolithography and plating, and so forth, on the first wiring layer 18 which extends to the surface of the respective insulation film 16 on the unmounted surface 12c. Further, gold (Au) may be used as well as copper for the formation of the post portions 20.

In addition, following the formation of the copper post portions 20, a thin oxidation film may be formed by means of thermal oxidation and the like on the sides of the post portions 20. In such a case, because the adhesiveness between the post portions 20 and the sealing layer 22 is raised still further, the invasion of moisture via the interface between the post portions 20 and the sealing layer 22 (described subsequently) can be further suppressed.

Next, the sealing layer 22 is formed on the side of the mount surface 12a of the substrate 12 where the post portions 20 are formed by means of transfer molding by using a sealing material that comprises an organic resin (epoxy resin and the like) to the point where the post portions 20 are hidden. Thereafter, a mount surface for mounting the external terminals is formed by grinding the sealing layer 22 and the post portions 20 by means of a grinder (grinding tool) and the like so as to expose the top surfaces of all the post portions 20. When the post portions 20 are formed, in a case where the post portions 20 can be formed so as to have the same height in the upright direction, the grinding step for the formation of an external terminal mount surface by means of film forming or similar could also be omitted.

Figure 3C:
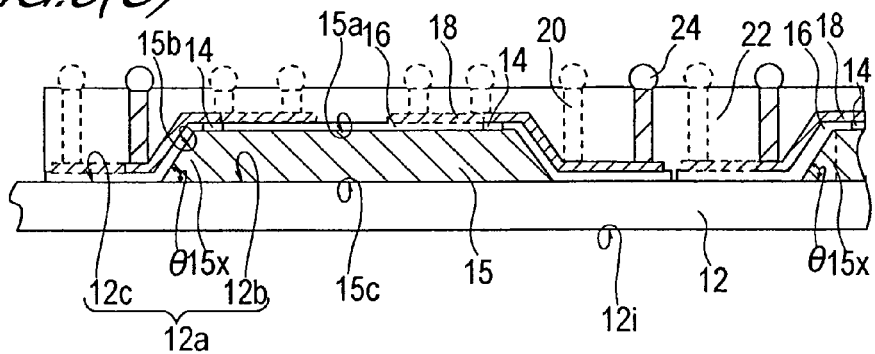

As shown in FIG. 3(C), when a given period has elapsed, the solder balls 24 which constitute external terminals which are bumps permitting a connection with a print substrate (not shown) are formed by means of reflow on the exposed external terminal mount surface. Further, depending on requirements, a barrier metal layer or similar may be formed between the external terminal mount surface and the solder balls 24. According to this constitutional example, the minimum interval (pitch) between the solder balls 24 which are external terminals can be extended to 0.3 mm or more, for example.

Thereafter, cutting (see FIG. 1(B)) into individual semiconductor devices (packages) 10 is carried out by means of an ordinary high-speed rotary blade (cutting tool) or similar (not shown) used for scribing.

As is clear from the above description, according to the semiconductor device of this embodiment, by mounting the first semiconductor chip on the semiconductor chip carrying portion, a structure (fan-out structure) in which external terminals are arranged, not only above the first semiconductor chip (that is, the fan-in section), but also in a region other than above the first semiconductor chip (that is, the fan-out section) can be realized by means of the first wiring layer that extends from the main surface of the first semiconductor chip to above the side wall surfaces and the unmounted surface.

Accordingly, a semiconductor device better adapted to a larger number of pins than an ordinary WCSP can be obtained.

In other words, with a conventional semiconductor device, the chip size of an ordinary WCSP is only undesirably enlarged for a larger number of pins, and the cumulative chip number per wafer is reduced, whereas, according to this embodiment, unlike the conventional case, the semiconductor device can be afforded a fan-out structure by means of a semiconductor chip carrying portion that functions as an extension section to enable the placement positions of the external terminals to be extended.

As a result, a semiconductor device capable of adapting to a larger number of pins can be implemented, and, for example, in a case where the chip size is approximately 7 mm×approximately 7 mm and the outer dimensions of the semiconductor chip carrying portion are approximately 10 mm×approximately 10 mm, 312 pins can be placed with the external terminal pitch set at 0.5 mm, for example.

Further, according to the present embodiment, because the first electrode pads and solder balls are electrically connected via the first re-distribution wiring layer, a reduction in the total signal wiring length in comparison with a case where the WB method is adopted is possible.

As a result, for example, in a case where a high frequency signal is transmitted, decay of this signal can be effectively suppressed in comparison with the WB method and matching between the characteristic impedance of the signal wires and the impedance of the semiconductor chip is straightforward, and, accordingly, a semiconductor device with high frequency characteristics that surpass those of the prior art is produced.

Further, because there is no need to use an expensive substrate which is subjected to through-hole processing and so forth beforehand, as is the case with a BGA or similar that adopts the WB method, a reduction in the fabrication costs of the semiconductor device is also feasible.

In addition, if a disk-shaped silicon wafer is employed as the substrate 12, an existing WCSP device fabrication process can be applied. Therefore, because a new tool for holding the substrate, or similar is unnecessary, costs can be reduced.

Second Embodiment

Figure 4A:
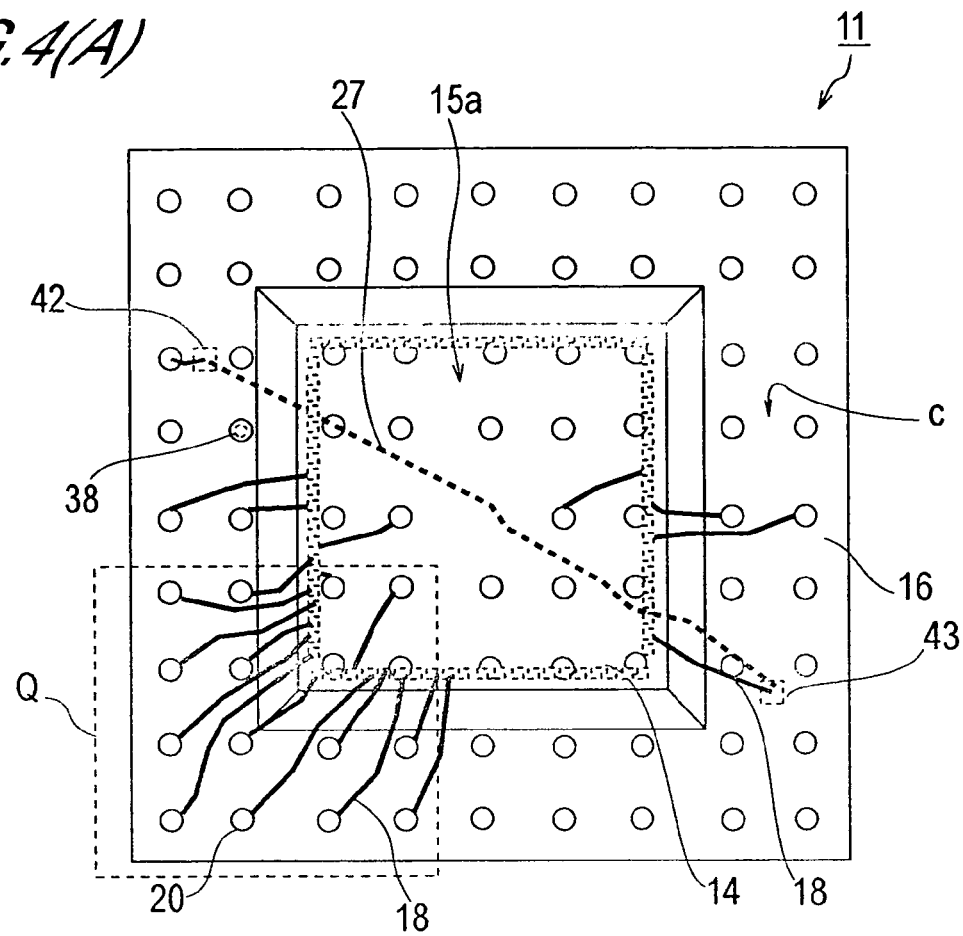
FIG. 4(A) shows an outline planar view of a semiconductor device according to a second embodiment of the present invention.
Figure 4B:
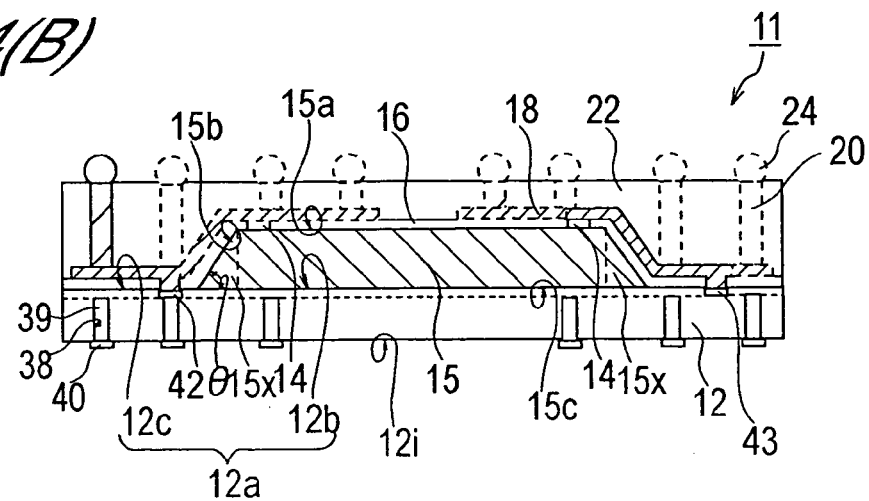
FIG. 4(B) is an outline cross-sectional view of part of the semiconductor device according to the second embodiment of the present invention.

A description will now be provided for a semiconductor device 11 according to the second embodiment of the present invention, with reference to FIGS. 4(A) and 4(B).

The principal points of difference between the first and second embodiments are as follows. First, a through-hole 38 is formed as a perforation in the substrate 12 which is a semiconductor chip carrying portion, this through-hole 38 comprising a conductive portion 39 affording conduction between the two sides of the substrate 12, that is, from the third main surface 12a through to the fourth main surface 12i. The conductive portion 39 is electrically connected to the first wiring layer 18, and the substrate 12 comprises a wiring portion 27 that transects the regional part facing the first semiconductor chip 15, the wiring portion 27 being electrically connected to the first wiring layer 18. Further, constituent elements which are the same as those already described in the first embodiment are shown with the same numerals assigned thereto, and hence a specific description of these elements is sometimes omitted (as is also the case for the embodiments below). Further, in this constitutional example, a description is provided by citing, as an example, a case of using a double-sided substrate (glass epoxy double-sided substrate or similar), as the substrate 12, this substrate being patterned with wiring by means of a conductor (here, copper (Cu) foil) on both sides of a base material that constitutes the substrate 12.

As shown in FIG. 4(B), the through-hole 38 is formed in the substrate 12, and the conductive portion (copper plating layer) 39 is formed over the whole of the inner wall of the through-hole 38 so as to afford conduction between the two sides of the substrate. A first land 42 and a third pad 40 are formed at the two ends of the conductive portion 39 of the through-hole 38 respectively. The first land 42 and third pad 40 are formed on the surface of the substrate 12 by using copper foil.

Further, the conductive portion 39 of the through-hole 38 is electrically connected to the first wiring layer 18 via the first land 42 which is exposed rather than being covered by the insulation layer 16. Also, the third pad 40 as used here is used as a mount pad for a semiconductor device when the semiconductor device is formed as a package stacked-type semiconductor device or as a mount pad for passive elements such as a coil, a condenser, and so forth, for example.

Also, in a case where a package stacked-type semiconductor device is constituted by the semiconductor device 11, the solder balls 24 of the semiconductor device 11 are joined to the third pad 40 of the semiconductor device 11 which comprises the same structure, for example, and a plurality of stacked layers is possible in the thickness direction of the first semiconductor chip 15.

In addition, in the present embodiment, the wiring portion 27, which extends in a direction substantially orthogonal to the thickness direction of the substrate 12 is formed in the substrate 12.

For example, as shown in FIG. 4(A), the wiring portion 27 (not shown in FIG. 4(B)) is formed in the substrate 12 by patterning by means of copper foil according to a dispositional relationship which is such that the wiring portion 27 is substantially orthogonal to the thickness direction of the substrate 12 and transects the regional part facing the first semiconductor chip 15. Further, the wiring portion 27 is constituted so as to be electrically connected to the first wiring layer 18 via a second pad 43 which is located at both ends of the wiring portion 27 (only one side is shown in FIG. 4(B)).

According to the constitution of the first embodiment, the solder balls 24 which are electrically connected to the first pads 14 are only solder balls 24 whose one end is connected to the first pads 14 and which can be arranged above the first wiring layer 18 which extends above the unmounted surface 12c along the first main surface 15a and side wall surfaces 15b of the first semiconductor chip 15 (see FIG. 1(A)).

Therefore, as shown in FIG. 4(A), by employing the substrate 12 which is formed patterned with the wiring portion 27 as the semiconductor chip carrying portion, when any one solder ball of a plurality of solder balls is selected for a certain single first pad 14, a connection is permitted to the selected solder ball sequentially via the first wiring layer 18, the wiring portion 27 and the other first wiring layer 18. The wiring withdrawal freedom can therefore be increased considerably.

Further, an output signal from the first semiconductor chip 15 of this constitutional example is transmitted via at least one path among: a path that extends from the first pads 14 to the solder balls 24 via the first wiring layer 18 and the post portions 20, a path that extends from the first pads 14 to the solder balls 24 via the first wiring layer 18, the second pad 43, the wiring portion 27, the second pad 43, the first re-distribution wiring layer 18 and the post portions 20, and a path that extends from the first pads 14 to the third pad 40 via the first wiring layer 18, the first land 42, and the through-hole 38. Further, an input signal from the solder balls 24 and the third pad 40 is transmitted via paths which are the reverse of the above paths. The transmission path is not restricted to the above paths and may be formed as a variety of wiring paths depending on the objectives and the design.

Furthermore, the fabrication method of the semiconductor device 11 of this embodiment comprises the same steps as the fabrication steps described in the first embodiment but differs with respect to the following steps. In other words, in the step of mounting the first semiconductor chip 15 on the substrate 12, the through-hole 38 and the exposed first land 42 and second pad 43 are formed beforehand in predetermined positions in the substrate 12. Further, the first semiconductor chip 15 is mounted on and fixed to the substrate 12 via a die bonding agent or similar (not shown).

Further, as per the first wiring layer formation step described in the first embodiment, first, the insulation film 16 is formed so as to expose the respective top surface, for example, of the first pads 14, the first land 42 and the second pad 43. Following the formation of the insulation film 16, the first wiring layer 18 is formed such that the first pads 14, and the first land 42 or second pad 43 indicated by the connection relationship with the first pads 14, are connected.

Thereafter, as in the first embodiment, the external terminal formation step is carried out and the semiconductor device 11 is thus obtained. The through-hole 38 which the substrate 12 (a glass epoxy double-sided substrate here) comprises is constituted such that a perforation hole is formed by a drill or similar in the substrate prior to forming the patterning by means of copper foil in the vicinity of the surface layer of the substrate, and such that the copper plating layer (conductive portion) 39 is formed by plating or similar of the inner wall of the perforation hole, for example.

As is clear from the above description, the present embodiment makes it possible to obtain effects like those for the first embodiment.

In addition, the present embodiment makes it possible, more so than the first embodiment, to electrically connect the first pads to a desired external terminal by means of the wiring portion patterned on the substrate which is the semiconductor chip carrying portion, whereby the wiring withdrawal freedom can be increased.

Moreover, in a case of implementing a package stacked-type semiconductor device by stacking the semiconductor device 11, because a fan-in structure, which was problematic for a conventional WB method package stacked-type semiconductor device, is possible, miniaturization of the package size and thinner films are feasible.

Third Embodiment

A description will now be provided for a semiconductor device 50 according to the third embodiment of the present invention, with reference to FIGS. 5 and 6.

In this embodiment, the main point of difference from the first embodiment is that the semiconductor chip carrying portion is a second semiconductor chip 44 which comprises circuit elements and that the second semiconductor chip 44 is electrically connected to the first wiring layer 18.

Figure 5A:
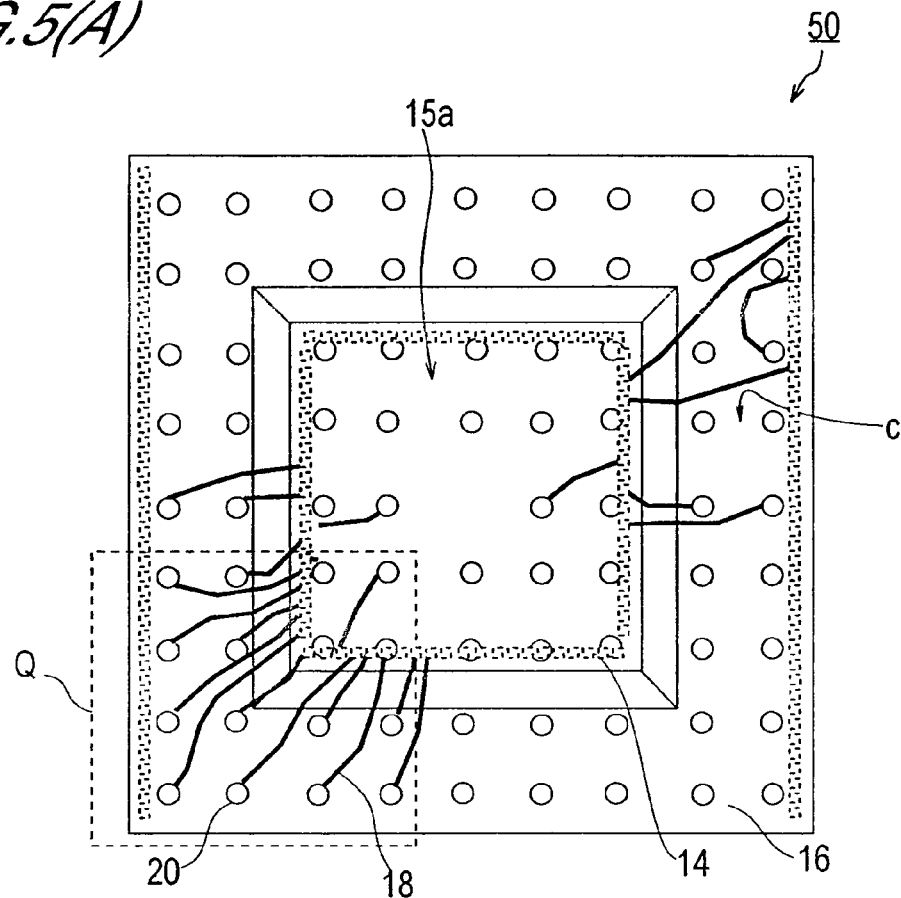
FIG. 5(A) shows an outline planar view of a semiconductor device according to a third embodiment of the present invention.

As shown in FIG. 5(A), the planar form of the second semiconductor chip 44 which is the semiconductor chip carrying portion is square. Fourth pads 45 comprising aluminum (Al) are arranged at predetermined intervals along the perimeter of the second semiconductor chip 44, on a mount surface 44a which constitutes the third main surface of the second semiconductor chip 44, and the fourth pads 45 are constituted so as to be electrically connected to the first wiring layer 18. Further, the placement quantity of the fourth pads 45 and the positions thereof are not restricted to those shown in FIG. 5(A).

Also, output signals from the first semiconductor chip 15 of this constitutional example are transmitted via both or either of a path that extends from the first pads 14 to the solder balls 24 via the first wiring layer 18 and the post portions 20 and a path that extends from the first pads 14 to the second semiconductor chip 44 via the first wiring layer 18 and the fourth pads 45. Further, input signals from the solder balls 24 and the second semiconductor chip 44 are transmitted via (a) path(s) which is (are) the reverse of the above path(s). The transmission path is not restricted to the above paths and may be formed as a variety of wiring paths depending on the objectives and the design.

Thus, according to the constitutional example, because the semiconductor chip carrying portion is the second semiconductor chip 44, the semiconductor device 50 is an MCP-type semiconductor device in which the first semiconductor chip 15 is stacked on the mount surface 44b of the second semiconductor chip 44, whereby the degree of mounting can be raised.

Figure 6A:
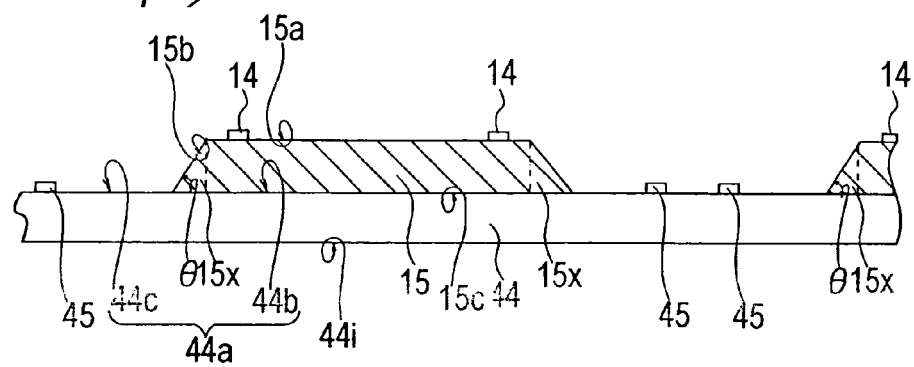
FIGS. 6(A) to 6(C) are outline cross-sectional views that are used to describe the fabrication steps of the semiconductor device according to a third embodiment of the present invention.
Figure 6B:
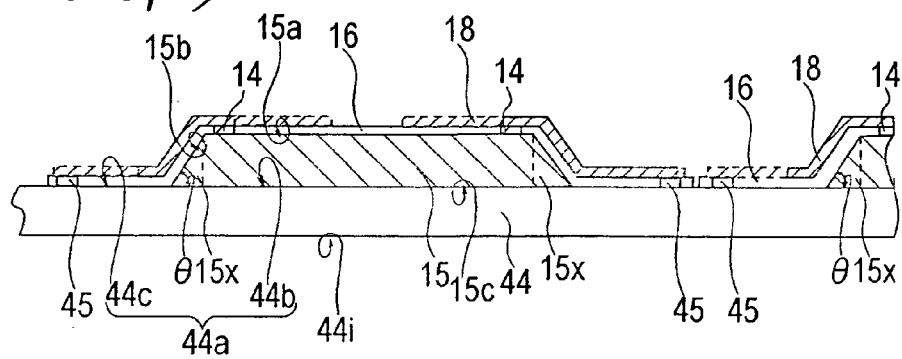

Further, like the mounting step of the first embodiment, the fabrication method of the semiconductor device 50 of this embodiment involves mounting and fixing the first semiconductor chip 15 (see FIG. 6(A)) via a die bonding agent (not shown) on the second semiconductor chip 44 which is the semiconductor chip carrying portion on which fourth pads 45 are formed at predetermined intervals such as every 0.035 mm to 0.18 mm, for example. Also, like the first wiring layer formation step described in the first embodiment, the insulation film 16 is formed so as to expose the top surface of the first pads 14, and the top surface of the fourth pads 45 connected to the first wiring layer 18. Following the formation of the insulation film 16, the first wiring layer 18 is formed so as to extend from the side wall surfaces 15b to an unmounted surface 44c and so as to be connected to the fourth pads 45 (FIG. 6(B)). Further, in this constitutional example, a connection of the fourth pads 45 and the first wiring layer 18 in a one-to-one relationship is specified.

Figure 5B:
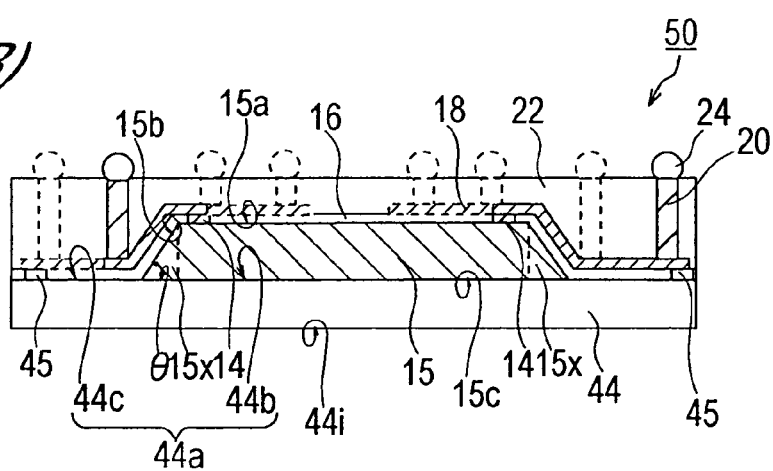
FIG. 5(B) is an outline cross-sectional view of part of the semiconductor device according to the third embodiment of the present invention.
Figure 6C:
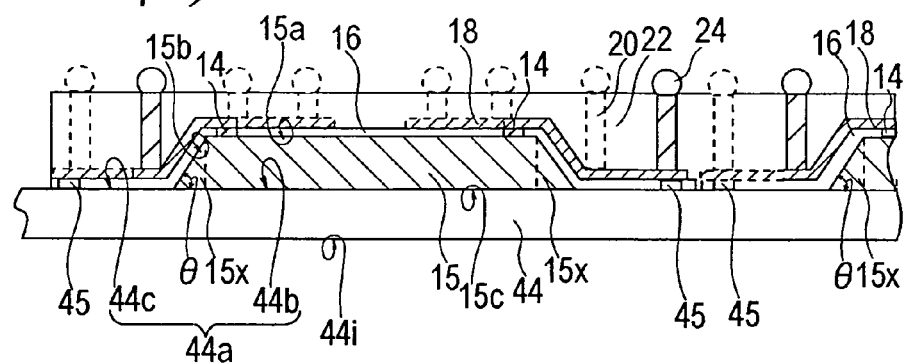

Thereafter, the external terminal formation step is carried out in the same way as in the first embodiment (FIG. 6(C)), and the semiconductor device 50 is thus obtained (FIG. 5(B)).

As is clear from the above description, the present embodiment makes it possible to obtain effects like those for the first embodiment.

In addition, with this embodiment, in addition to a substrate comprising bonding post portions or similar as used in a conventional WB method MCP or similar being unnecessary, no consideration need be paid to the height component of the wire loops during fabrication of the semiconductor device.

Therefore, according to the constitution of the present embodiment, an MCP structure semiconductor device with outer dimensions which are substantially the outer dimensions of the second semiconductor chip 44 can be implemented, whereby a semiconductor device, in which miniaturization of the package size and thinner films are implemented in comparison with a conventional WB method MCP, is produced.

Fourth Embodiment

A description will now be provided for a semiconductor device 60 according to the fourth embodiment of the present invention, with reference to FIG. 7.

In this embodiment, the main point of difference from the third embodiment is that this embodiment comprises a second wiring layer 49 passing between the first semiconductor chip 15 and the second semiconductor chip 44 and that the second wiring layer 49 is constituted so as to be electrically connected to the first wiring layer 18.

More specifically, the second wiring layer 49 (the second wiring layer is also called the second re-distribution wiring layer hereinafter), which is disposed so as to transect the first semiconductor chip 15 below the first semiconductor chip 15 in a direction substantially orthogonal to the thickness direction of the second semiconductor chip 44, is formed above the second semiconductor chip 44. Further, the second wiring layer 49 extends above an insulation film 21 which is provided on the mount surface 44a which constitutes the third main surface of the second semiconductor chip 44, and one end of the second wiring layer 49 is electrically connected to the second semiconductor chip 44 via the fourth pads 45 and the other end of the second semiconductor chip 44 is connected to the first wiring layer 18 via a fifth pad 46.

According to the constitution the third embodiment, the solder balls 24, which are electrically connected to the first pads 14, are only solder balls 24 whose one end is connected to the first pads 14 and which can be arranged above the first wiring layer 18 which extends above the unmounted surface 44c along the first main surface 15a and side wall surfaces 15b of the semiconductor chip 15 (see FIG. 5(A)).

Figure 7A:
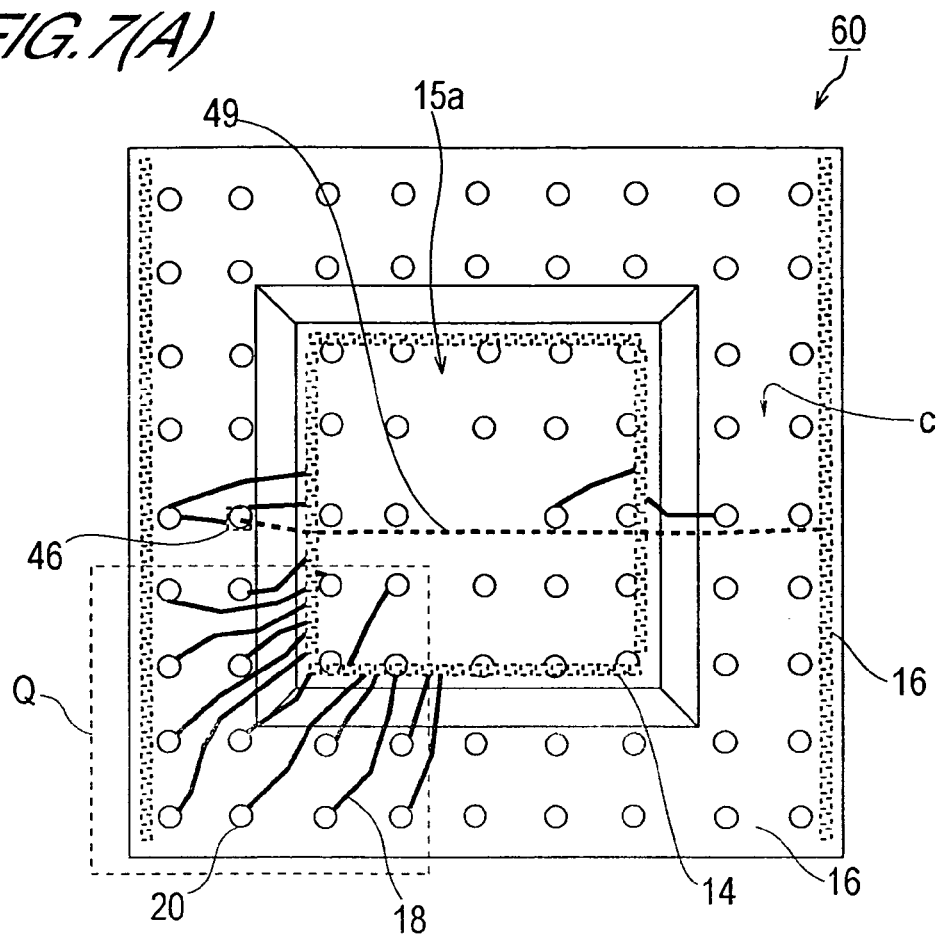
FIG. 7(A) shows an outline planar view of a semiconductor device according to a fourth embodiment of the present invention.
Figure 7B:
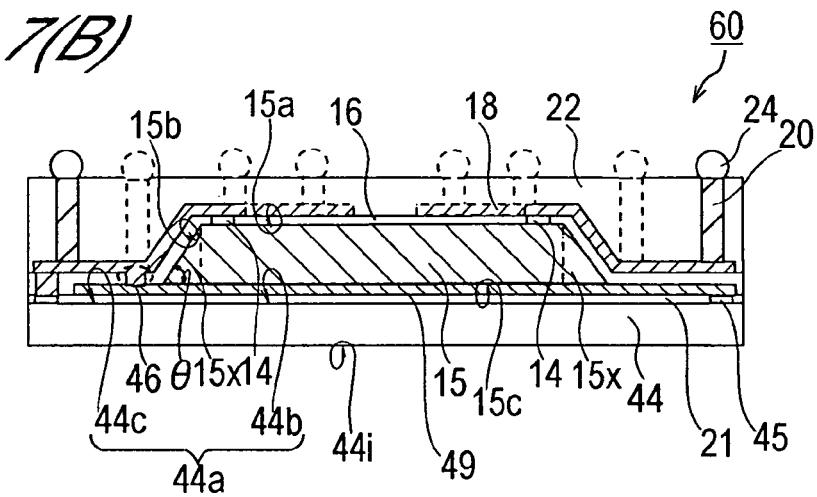
FIG. 7(B) is an outline cross-sectional view of part of the semiconductor device according to the fourth embodiment of the present invention.

Therefore, as shown in FIGS. 7(A) and 7(B), by providing the second wiring layer 49, when any one solder ball of a plurality of solder balls is selected for a certain single first pad 14, in comparison with the third embodiment, a connection is permitted to the selected solder ball sequentially via the first wiring layer 18, the second wiring layer 49 and the other first wiring layer 18. The wiring withdrawal freedom can therefore be increased considerably.

Further, the fabrication method of the semiconductor device 60 of this embodiment is such that, in the mounting step described in the third embodiment, the insulation film 21 is first formed so as to expose the top surface of the fourth pads 45 comprising aluminum (Al) which are provided in predetermined positions. Next, the second wiring layer 49 comprising copper is formed by patterning so as to extend to positions in which one end of this film 21 is connected to the fourth pads 45, while the other end is connected to a predetermined first wiring layer 18 in a later step. Thereafter, similar to the mounting step of the third embodiment, the first semiconductor chip 15 is mounted and fixed via die bonding agent (not shown) to a region on the mount surface 44b of the second semiconductor chip 44. Also, like the first wiring layer formation step described in the third embodiment, the insulation film 16 is formed so as to expose the top surface of the fifth pad 46 connected to the first wiring layer 18 of the second wiring layer 49, and then the first wiring layer 18 connected to the fifth pad 46 is formed. Then, as in the first embodiment, the external terminal formation step is carried out and the semiconductor device 60 is thus obtained.

As is clear from the above description, the present embodiment makes it possible to obtain effects like those for the third embodiment.

In addition, because the second wiring layer 49 is provided, the present embodiment makes it possible, more so than the third embodiment, to electrically connect the first pads to a desired external terminal, whereby the wiring withdrawal freedom can be increased.

Accordingly, for the convenience of functional block design positions and pad arrangement, existing semiconductor chips, which have a circuit constitution with which the creation of an MCP is problematic, can be used without further processing, and hence a new semiconductor chip need not be manufactured.

Fifth Embodiment

A semiconductor device 70 according to the fifth embodiment of the present invention will now be described with reference to FIG. 8.

In this embodiment, the main point of difference from the third embodiment is that a through-hole 52 is formed, for example, as a perforation that comprises a conductive portion 54 for affording conduction between the two sides of the second semiconductor chip 44, in the second semiconductor chip 44 which is the semiconductor chip carrying portion and that the conductive portion 54 is electrically connected to the first wiring layer 18. This constitutional example is suitable even when applied to the fourth embodiment.

Figure 8A:
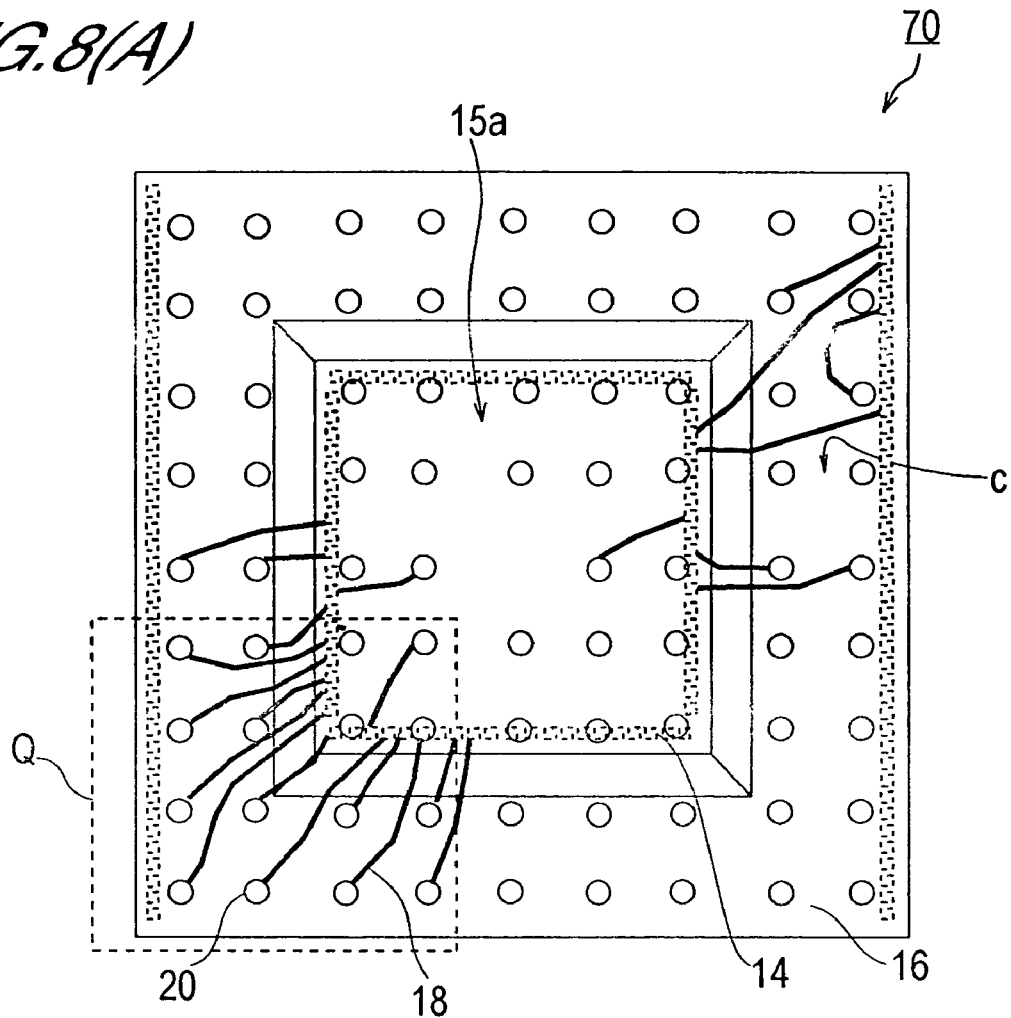
FIG. 8(A) shows an outline planar view of a semiconductor device according to a fifth embodiment of the present invention.
Figure 8B:
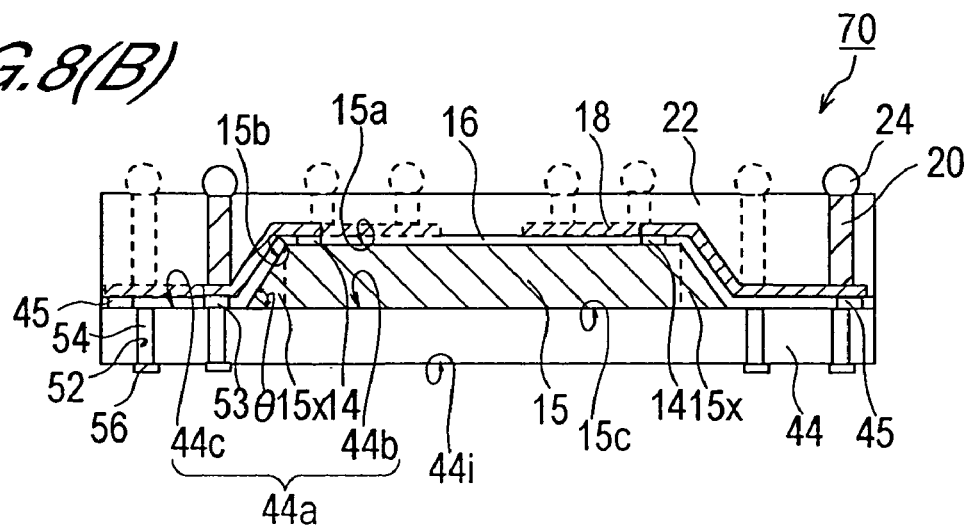
FIG. 8(B) is an outline cross-sectional view of part of the semiconductor device according to the fifth embodiment of the present invention.

As shown in FIGS. 8(A) and 8(B), the through-hole 52 is provided in the second semiconductor chip 44 which is the semiconductor chip carrying portion. An insulation film such as a silicon oxidation film or similar is provided on the inner wall surface of the through-hole 52, and the conductive portion (copper, nickel (Ni) or similar) 54 is formed on the inner wall insulation film. As a result of this conductive portion 54, conduction between the two sides of the second semiconductor chip 44 is possible. Further, a second land 53 and a sixth pad 56, which are formed on the second semiconductor chip, are formed at both ends of the conductive portion 54 of the through-hole 52 so as to be electrically connected with the conductive portion 54.

Further, the top surface of the second land 53 is exposed rather than being covered by the insulation film 16. Therefore, the conductive portion 54 of the through-hole 52 is electrically connected to the first wiring layer 18 via the second land 53. Also, the sixth pad 56 as used here is a mount pad for a semiconductor device when the semiconductor device is formed as a package stacked-type semiconductor device or a mount pad for passive elements such as a coil, a condenser, and so forth, for example.

Also, in a case where the semiconductor device is a package stacked-type semiconductor device, the solder balls 24 of the semiconductor device 70 are joined to the sixth pad 56 of the semiconductor device 70 which comprises the same structure, for example, and a plurality of stacked layers is possible in the thickness direction of the first semiconductor chip 15.

Also, output signals from the first semiconductor chip 15 of this constitutional example are transmitted via at least one path among: a path that extends from the first pads 14 to the solder balls 24 via the first wiring layer 18 and the post portions 20, a path that extends from the first pads 14 to the second semiconductor chip 44 via the first wiring layer 18 and the fourth pads 45, and a path that extends from the first pads 14 to the sixth pad 56 via the first wiring layer 18, the second land 53, and the through-hole 52. Further, input signals from the solder balls 24, the second semiconductor chip 44, and the sixth pad 56 are transmitted via paths which are the reverse of the above paths. The transmission path is not restricted to the above paths and may be formed as a variety of wiring paths depending on the objectives and the design.

Further, the fabrication method of the semiconductor device 70 of this embodiment involves, like the mounting step described in the third embodiment, mounting and fixing the first semiconductor chip 15 via a die bonding agent (not shown) on the mount surface 44b of the second semiconductor chip 44 on which the through-hole 52 and the exposed second land 53 and the fourth pads 45 are formed beforehand in predetermined positions.

Further, as in the first wiring layer formation step described in the third embodiment, the insulation film 16 is first formed so as to expose the surface of the second land 53, and then the first wiring layer 18 whose connection relationship with the second land 53 is specified is formed.

Thereafter, as in the first embodiment, the external terminal formation step is carried out and the semiconductor device 70 is thus obtained. The through-hole which the second semiconductor chip 44 comprises is constituted such that a perforation hole is formed by dry etching of the region in which the through-hole is planned, and such that the inner wall of the perforation hole is insulated with a silicon oxidation film ($SiO_2$) or silicon nitride film (SiN) or similar and then filled with copper or the like, for example.

As is clear from the above description, the present embodiment makes it possible to obtain effects like those for the fourth embodiment.

In addition, with the present embodiment, in a case where the semiconductor device 70 is stacked to produce a package stacked-type semiconductor device, it is possible to implement higher density mounting than with the second embodiment because the semiconductor chip can be afforded a higher stacking number per unit height.

Sixth Embodiment

A description will now be provided for a semiconductor device 80 according to the sixth embodiment of the present invention, with reference to FIGS. 9 to 11.

Figure 9A:
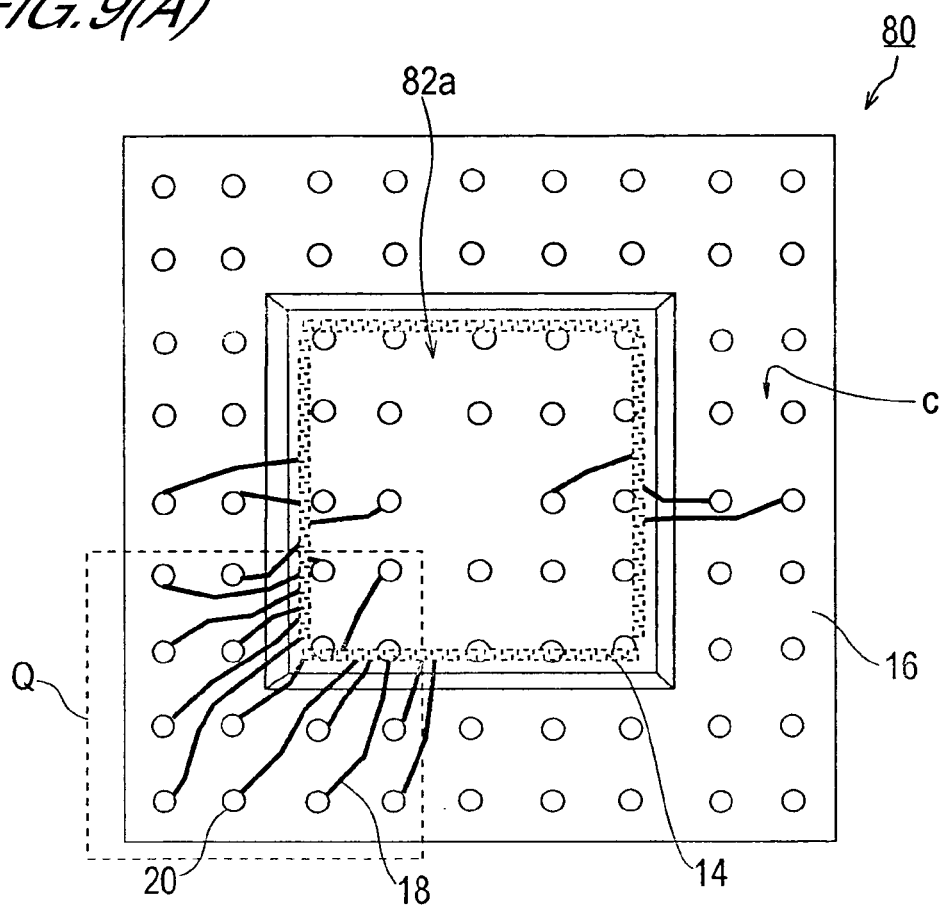
FIG. 9(A) shows an outline planar view of a semiconductor device according to a sixth embodiment of the present invention.

As shown in FIG. 9(A), the first pads 14 comprising aluminum are arranged on the main surface of a first semiconductor chip 82 which the semiconductor device 80 comprises at predetermined intervals along the perimeter of the first semiconductor chip 82.

Figure 9B:
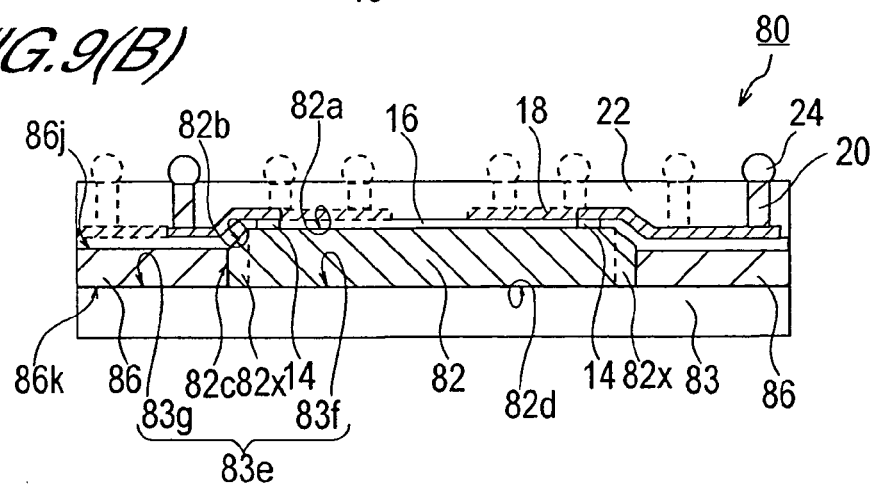
FIG. 9(B) is an outline cross-sectional view of part of the semiconductor device according to the sixth embodiment of the present invention.

As shown in FIG. 9(B), the first semiconductor chip 82 is mounted and fixed on a substrate mount surface 83e in the substrate 83 which constitutes a support section. In the mount surface 83e, the region in which the first semiconductor chip 82 is actually mounted is the mount surface 83f, and the region outside this region is the unmounted surface 83g. The first semiconductor chip 82 comprises a second main surface 82d which is the reverse side of the substrate 83, a first main surface 82a which is the main surface on the opposite side to the reverse side 82d, an inclined side wall surface 82b which is connected to the periphery of the main surface 82a, and a vertical wall surface 82c which is vertical with respect to the mount surface 83e of the substrate and formed as a continuation of the inclined side wall surface 82b. The inclined side wall surface 82b is formed by obliquely chamfering the ridge portion between the first main surface 82a of the first semiconductor chip and the wall surface lying orthogonal to this surface, the remainder being the vertical wall surface 82c.

Further, the second main surface 82d which is the reverse side of the first semiconductor chip 82 and the mount surface 83f of the substrate are fixed (stuck) together by means of a die bonding agent (not shown). Further, although the already described variety of substrates can be employed as the substrate 83 which is the support section of the constitutional example, any substrate affording the functions of a support section is acceptable.

In addition, a frame-shape portion 86 comprising photosensitive resin (photosensitive polyimide or similar) is provided on the substrate unmounted surface 83g so as to surround the side wall of the first semiconductor chip 82, and more precisely so as to expose at least the surface region on the first main surface 82a-side of the inclined side wall surface 82b, so as to encircle the first semiconductor chip 82 at a height that reaches the inclined side wall surface 82b in the side walls 82x of the first semiconductor chip 82, for example.

Further, the insulation film 16 is formed above the first main surface 82a, the inclined side wall surface 82b and the unmounted surface 83g of the first semiconductor chip 82, so as to expose the top surface of the first pads 14 on the main surface of the first semiconductor chip 82. Also, the first pads 14 are individually connected electrically to the solder balls 24 that constitute the external terminals permitting a connection to a mounting substrate via a dedicated first wiring layer (also referred to as the 'first re-distribution wiring layer' or 'first wiring pattern') 18.

More precisely, the first wiring layer 18 of this constitutional example is constituted such that one end thereof is connected to the first pads 14 and so as to extend along the top of the inclined side wall surface 82b of the first semiconductor chip 82 and the third main surface 86j of the frame-shape portion 86 such that the cross-section thereof bends in accordance with the vertical interval between the first main surface 82a and the third main surface 86j of the frame-shape portion 86. The extending part of the first wiring layer 18 is electrically connected via the post portions 20 to the solder balls 24 whose electrical connection to the first pads 14 is specified.

Furthermore, the sealing layer 22, which is formed from epoxy resin or similar, is formed above the first semiconductor chip 82 and the frame-shape portion 86 so as to cover the insulation film 16 and the first wiring layer 18 and the like, and such that the top surface of the post portions 20 are exposed. The upper surface of the sealing layer 22 is a level surface. Further, the solder balls 24, which are bumps used for a connection to a print substrate (not shown) or similar are formed on the post portions 20.

In addition, output signals from the first semiconductor chip 82 of this constitutional example are transmitted to a path that extends from the first pads 14 to the solder balls 24 via the first wiring layer 18 and the post portions 20. Also, input signals from the solder balls 24 are transmitted via a path which is the reverse of the above-mentioned path.

Next, a description will be provided below for the fabrication method of a semiconductor device 80, with reference to FIGS. 10 and 11.

First of all, as far as the inclined side wall surface formation step is concerned, the inclined side wall surface 82b is formed by chamfering the ridge portion between the first main surface 82a and the side wall surface 82c of the first semiconductor chip which comprises the first main surface 82a on which the first pads 14 are formed, the second main surface 82d which is located on the reverse side of the first main surface 82a and whose surface area is larger than that of the first main surface, and the side wall surface 82c that connects between the first and second main surfaces (82a and 82d), whereby a mesa-type first semiconductor chip 82 is obtained.

Figure 10A:
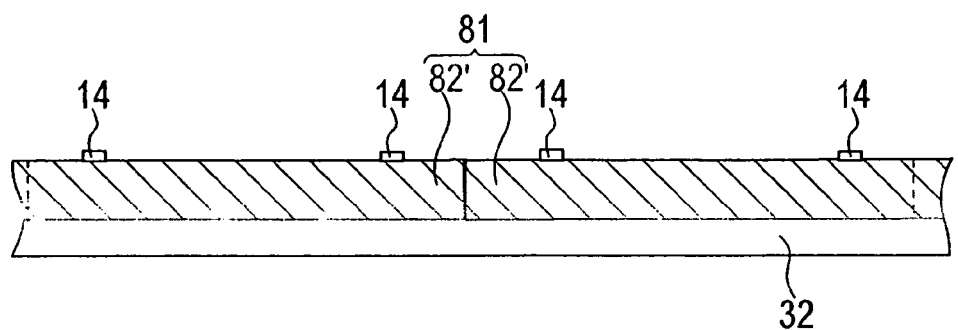
FIGS. 10(A) to 10(C) are outline cross-sectional views that are used to describe the fabrication steps of the semiconductor device according to the sixth embodiment of the present invention.

Therefore, first, a semiconductor wafer 81, which comprises a plurality of first semiconductor chips 82' prior to division, is prepared. As shown in FIG. 10(A), the first pads 14 are each formed at a predetermined interval such as 0.035 mm to 0.18 mm, for example, on the main surface of the first semiconductor chip 82' prior to division. The reverse side of this wafer 81 is fixed as a result of being bonded by means of wafer fixing tape 32 coated with adhesive (not shown). Further, although, for the purpose of expediency, approximately two first semiconductor chips 82' prior to division are shown in the figure, the wafer 81 is not limited to two such chips. Further, scribe lines (not shown) on the order of 0.08 mm are formed between the first semiconductor chips 82' prior to division which neighbor each other within the semiconductor wafer 81.

Figure 10B:
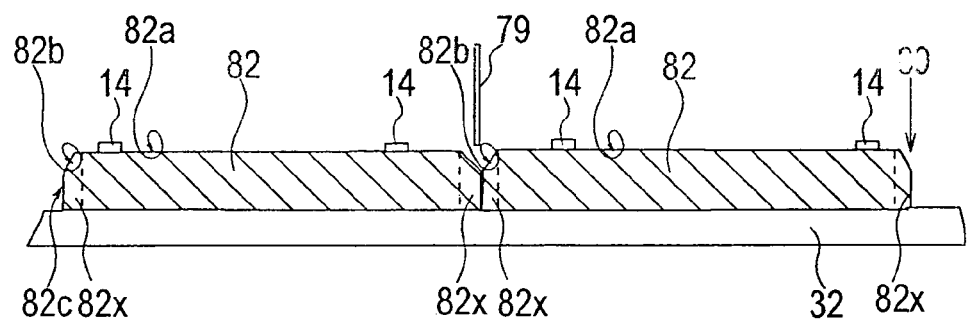

Next, as shown in FIG. 10(B), chamfering of the ridge portion of each first semiconductor chips 82' prior to division is performed by means of a high-speed rotary blade (cutting tool) or similar. The edge of the blade used at such time has an angle (vertical angle) φ (about 60°<θ<90°, for example) such that the cross-sectional shape of the edge is V-shaped. Here, the inclined side wall surfaces 82b are formed in accordance with the formation of a groove 89 which is cut in a V shape. Then, after the formation of the inclined side wall surface 82b, division, that is, separation into individual first semiconductor chips 82 is carried out by means of an ordinary blade 79 or similar used for scribing.

Next, as far as the frame-shape portion formation step is concerned, the frame-shape portion 86, which comprises the third main surface 86j and a fourth main surface 86k that is opposite to the third main surface, and which comprises an opening whereby at least the first semiconductor chip first main surface 82a-side surface region of the inclined side wall surface 82b is disposed so as to be exposed, is formed on the support section 83 so as to be disposed facing the fourth main surface 86k and the support section 83.

The frame-shape portion 86 is formed on the substrate 83 constituting the support section, and here, in a subsequent step as described subsequently, the first semiconductor chip 82 is housed within the frame of the frame-shape portion 86, that is, in the opening thereof, such that the side walls of the chip are surrounded and at least part of the inclined side wall surface 82b is exposed.

Figure 10C:

Therefore, as shown in FIG. 10(C), the frame-shape portion 86 is formed on the common substrate 83 by means of photolithography and curing processing, for example, after the photosensitive resin material is spin-coated. A high precision print method or similar could also be applied in the formation of the frame-shape portion 86. In the mount surface 83e of the substrate, the exposed surface of the substrate 83 enclosed by the frame-shape portion 86 is the mount surface 83f.

Next, as far as the mounting step is concerned, the first semiconductor chip 82 is mounted on the support section 83 as a result of being disposed within the opening. For this reason, the first semiconductor chip 82 is sized to mate with the frame-shape portion 86 substantially without a gap.

Figure 11A:
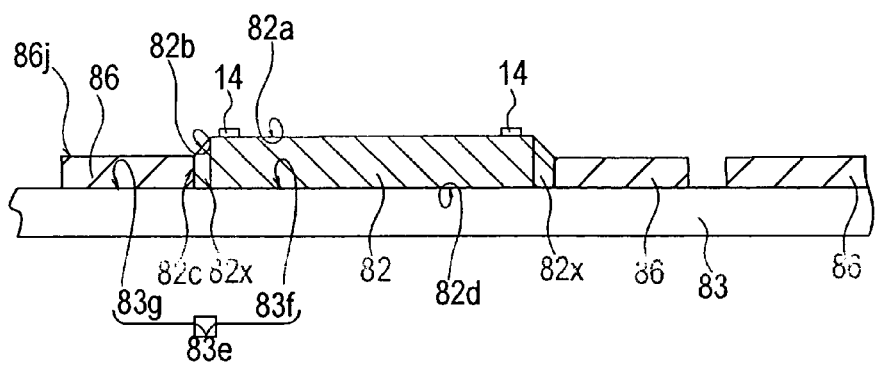
FIGS. 11(A) to 11(C) are outline cross-sectional views that are used to describe the fabrication steps of the semiconductor device according to the sixth embodiment of the present invention.

As shown in FIG. 11(A), the divided first semiconductor chips 82 are mounted in predetermined positions on the common substrate 83, here, on the mount surface 83f. When the first semiconductor chips 82 are mounted on the mount surface 83f, the side walls of the first semiconductor chip 82 are surrounded by the frame-shape portion 86. Here, the second main surface 82d which is the reverse side of the first semiconductor chip 82 and the mount surface 83f are fixed together by means of a die bonding agent (not shown), for example. Further, in this constitutional example, by mounting the first semiconductor chip 82 on the mount surface 83f before completely curing the photosensitive resin that constitutes the frame-shape portion 86 (during pre-curing, for example), the adhesiveness between the first semiconductor chip 82 and the photosensitive resin 86 can be increased further. As a result, the generation of a gap (void) between the first semiconductor chip 82 and the photosensitive resin 86 can be suppressed and an interface which is superior in terms of damp resistance can be formed.

Next, as far as the first wiring layer formation step is concerned, the first wiring layer 18, which is electrically connected to the first pads 14 and extends from the first pads 14 along the first main surface 82a and the inclined side wall surface 82b to above the main surface 86j which is the third main surface of the frame-shape portion 86, is formed.

Figure 11B:
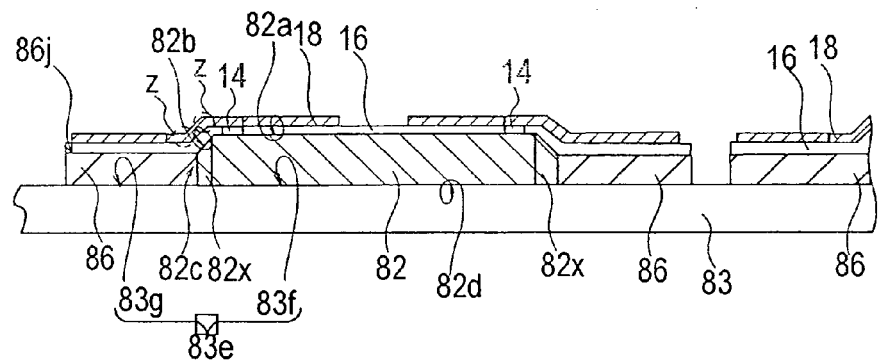
Figure 11C:
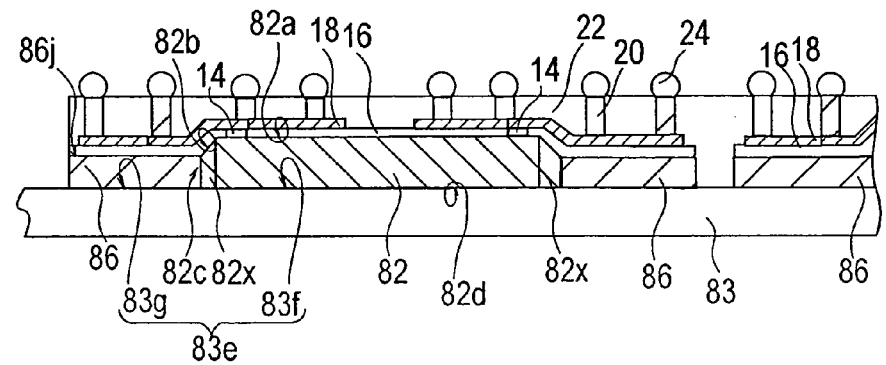

Therefore, as shown in FIG. 11(B), first of all, the insulation film 16, which comprises stacked films rendered by sequentially stacking a silicon oxidation film and a polyimide film, is formed extending over the first main surface 82a and the inclined side wall surface 82b of the first semiconductor chip 82, and the main surface 86j of the frame-shape portion 86 so as to expose the top surface, for example, of the first pads 14.

As a result of the presence of the vertical interval (step) between the first main surface 82a of the first semiconductor chip 82 and the surface of the frame-shape portion 86 which constitute surfaces underlying the insulation film 16, the insulation film is formed so as to correspond with this step.

Next, the first wiring layer 18 comprising copper is formed by photolithography and sputtering and the like so that one end thereof is connected to the first pads 14 and so as to extend from above the insulation film 16 to above the main surface 86j of the frame-shape portion 86 via the inclined side wall surface 82b such that the cross-section of the first wiring layer 18 bends in accordance with the vertical interval between the above-described first main surface 82a and the third main surface 86j of the frame-shape portion 86.

Here, the width of the parts of the first wiring layer which are located above the boundary between the first main surface 82a and the side wall surfaces 82b of the first semiconductor chip 82 and above the boundary between the side wall surfaces 82b and the main surface 86j of the photosensitive resin (the parts circled by the broken lines z in the figure) respectively, in a direction which is substantially orthogonal to the direction in which the first wiring layer 18 extends (in a direction orthogonal to the page of the illustration) may be formed so as to be thicker than the width of the other (remaining) parts of the first wiring layer.

As a result, the parts of the first wiring layer 18 above these boundaries which are susceptible to impacts and concentrations of stress can be reinforced.

Next, where the external terminal formation step is concerned, external terminals are formed above the part of the first wiring layer 18 which extends toward the frame-shape portion 86 so as to be electrically connected to the first pads 14 via the first wiring layer 18.

First of all, corresponding post portions 20 which comprise copper are formed by means of photolithography and plating, and so forth, on the first wiring layer 18 which extends to the surface of the respective insulation film 16 on the frame-shape portion 86.

Next, the sealing layer 22 is formed on the side of the mount surface of the substrate 83 where the post portions 20 are formed by means of transfer molding by using a sealing material that comprises an organic resin (epoxy resin and the like) to the point where the post portions 20 are hidden. Thereafter, a mount surface for mounting the external terminals is formed by grinding the sealing layer 22 and the post portions 20 by means of a grinder and the like so as to expose the top surfaces of all the post portions 20.

When a given period has elapsed, the solder balls 24 which constitute external terminals which are bumps permitting a connection with a print substrate (not shown) are formed by means of reflow on the exposed external terminal mount surface. According to this constitutional example, the minimum interval between the solder balls 24 which are external terminals can be 0.3 mm or more, for example (see FIG. 11(C)).

Thereafter, cutting (see FIG. 9(B)) into individual semiconductor devices (packages) 80 is carried out by means of an ordinary high-speed rotary blade without a chamfering action, or similar.

As is clear from the above description, the present embodiment makes it possible to obtain effects like those for the first embodiment.

In addition, with this embodiment, because the above-described frame-shape portion is provided, the part in the side wall of the first semiconductor chip which is exposed via the frame-shape portion may be the inclined side wall surface. Therefore, in this embodiment, the wall surface of the first semiconductor chip other than the inclined side wall surface can be a vertical wall (vertical end surface).

Therefore, because the dicing depth can be made shallow in comparison with a case where the inclined side wall surfaces are formed by dicing as far as the reverse side of the chip as per the first embodiment, the width of the wafer dicing line can be reduced.

As a result, the cumulative number of chips per wafer can be improved, whereby an increase in the fabrication costs of the semiconductor device can be suppressed.

Further, because it is possible to reduce the usage amount of a blade with the V-shaped edge which is susceptible to abrasion, in comparison with the first embodiment, not only is the lifespan of the blade extended, the cutting time during division into the first semiconductor chips can also be shortened.

Seventh Embodiment

Figure 12:
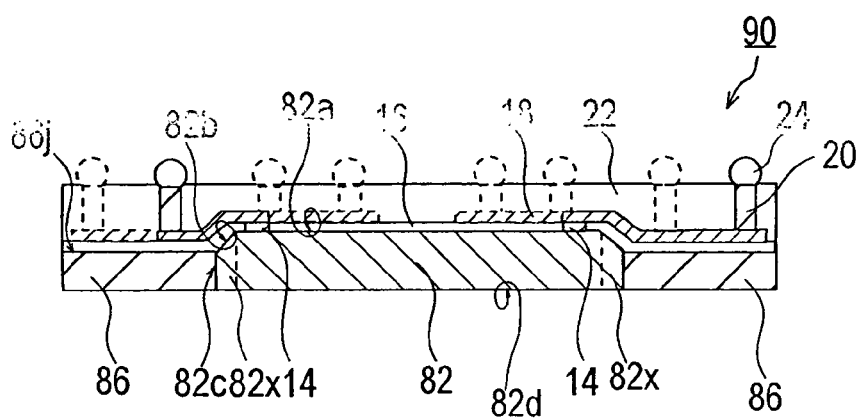
FIG. 12 is an outline cross-sectional view of part of the semiconductor device according to a seventh embodiment of the present invention.

A description will now be provided for a semiconductor device 90 according to the seventh embodiment of present invention with reference to FIG. 12.

As shown in FIG. 12, the main point of difference from the sixth embodiment is that the semiconductor device 90 of this embodiment is not equipped with the substrate 83 which is a support section.

Further, the fabrication method of the semiconductor device 90 of this embodiment is such that, in the mounting step described in the sixth embodiment, the second main surface 82d which is the reverse side of the first semiconductor chip 82 and the mount surface 83f are fixed together by means of a low adhesion adhesive (not shown). A cured polyimide film or similar which has undergone the introduction of a hydrophobic group by means of ashing processing with light plasma and CF4 plasma processing, and so forth, can be employed as the low adhesion adhesive, for example.

Further, after processing has been performed up to the external terminal formation step as per the sixth embodiment, in this embodiment a support section removal step is carried out which involves removal of the substrate 83 through detachment by means of a vacuum and the like, whereby the semiconductor device 90 is obtained.

As is clear from the above description, the present embodiment makes it possible to obtain effects like those for the sixth embodiment.

In addition, because this embodiment is constituted without being provided with the substrate 83 which is a support section, the semiconductor device can be afforded thinner films than in the sixth embodiment.

Also, because an adhesive like that in the sixth embodiment is unnecessary, dimensional errors caused by thermal expansion, and chemical resistance, and so forth, are not a cause for concern, and hence a highly reliable semiconductor device is produced.

Eighth Embodiment

Figure 13:
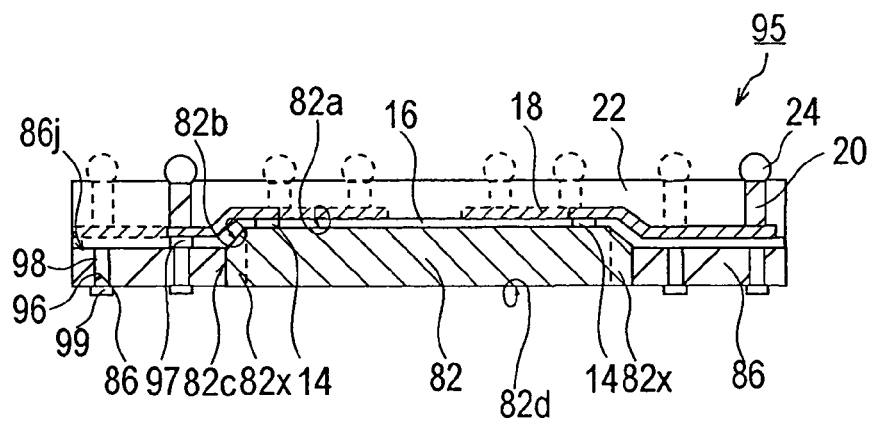
FIG. 13 is an outline cross-sectional view of part of the semiconductor device according to an eighth embodiment of the present invention.

A description will now be provided for a semiconductor device 95 according to an eighth embodiment of the invention with reference to FIG. 13.

In this embodiment, the main point of difference from the seventh embodiment is that a through-hole 96, which is a perforation comprising a conductive portion 98 affording conduction between the two sides of the substrate 83, is formed in the photosensitive resin 86 constituting the frame-shape portion, and that the conductive portion 98 is electrically connected to the first wiring layer 18.

As shown in FIG. 13, the through-hole 96 is formed in the photosensitive resin 86 constituting the frame-shape portion, and the conductive portion (copper plating layer) 98 is formed over the whole of the inner wall of the through-hole 96 so as to afford conduction between the two sides of the photosensitive resin 86. A third land 97 and a seventh pad 99 which comprise copper are formed at the two ends of the through-hole 96 respectively.

As per the above-described other embodiments, the conductive portion 98 of the through-hole 96 is electrically connected to the first wiring layer 18 via the exposed third land 97. Also, the seventh pad 99 as used here is used as a mount pad for a semiconductor device when the semiconductor device is formed as a package stacked-type semiconductor device or as a mount pad for passive elements such as a coil, a condenser, and so forth, for example.

Also, in a case where a package stacked-type semiconductor device is constituted by the semiconductor device 95, the solder balls 24 of the semiconductor device 95 are joined to the seventh pad 99 of the semiconductor device 95 which comprises the same structure, for example, and a plurality of stacked layers is possible in the thickness direction of the first semiconductor chip 82.

Also, output signals from the first semiconductor chip 82 of this constitutional example are transmitted via both or either of a path that extends from the first pads 14 to the solder balls 24 via the first wiring layer 18 and the post portions 20 and a path that extends from the first pads 14 to the seventh pad 99 via the first wiring layer 18, the third land 97, and the through-hole 96. Further, input signals from the solder balls 24 and the seventh pad 99 are transmitted via (a) path(s) which is(are) the reverse of the above path(s).

Furthermore, as per the mounting step described in the seventh embodiment, the fabrication method of the semiconductor device 95 of this embodiment involves mounting and fixing the first semiconductor chip 82 via a low adhesion adhesive (not shown) in a position such that this chip 82 is surrounded by the photosensitive resin 86 on which the through-hole 96 and the exposed third land 97 are formed beforehand in predetermined positions. Further, as per the first wiring layer formation step described in the seventh embodiment, first, the insulation film 16 is formed so as to expose the respective top surface of the first pads 14 and the third land 97, whereupon the first wiring layer 18 is formed such that the first pads 14, and the third land 97 indicated by the connection relationship with the first pads 14, are connected. Then, as per the seventh embodiment, processing is carried out as far as the external terminal formation step, and then a support section removal step is carried out which involves removal of the substrate 83 through detachment by means of a vacuum and the like. Thereafter, the seventh pad 99 is formed in a position that corresponds with the through hole 96 and the semiconductor device 95 is thus obtained. Further, the formation of the through-hole 96 of this constitutional example involves first forming a perforation hole by means of photolithographic etching of the photosensitive resin 86. Then, after coating the conductive portion 98 on the inner wall of the perforation hole by means of printing and so forth, the photosensitive resin is cured and the conductive portion 98 is formed by plating and so forth of the cured resin. Further, in this constitutional example, the first semiconductor chip 82 may be mounted before completely curing the photosensitive resin. In this case, the adhesive between the first semiconductor chip 82 and the photosensitive resin 86 can be further increased, whereby an interface with superior damp resistance can be formed.

As is clear from the above description, the present embodiment makes it possible to obtain effects like those for the seventh embodiment.

Moreover, in a case of implementing a package stacked-type semiconductor device by stacking the semiconductor device, because a fan-in structure, which was problematic for a conventional WB method package stacked-type semiconductor device, is possible, miniaturization of the package size and thinner films are feasible.

The invention described above is not limited to only combinations of the above-described embodiments. Hence, the invention can be applied by combining suitable conditions at optional suitable stages.

For example, although the above embodiments were described with regard to a BGA type package, the invention could also be applied optionally and suitably to an LGA-type package.

Further, in the above embodiments, semiconductor devices with a fan-in/fan-out structure were described, but, depending on the objectives and design, a case where only a fan-out structure is comprised is also possible.

As is clear from the above description, according to the invention, a fan-out structure in which the external terminals are arranged, not only above the first semiconductor chip (that is, the fan-in portion), but also in a region other than above the first semiconductor chip (that is, the fan-out portion), a semiconductor device which is more capable of adapting to an increase in the number of pins than an ordinary WCSP is produced.

Moreover, because the electrode pads on the semiconductor chip and the external terminals are electrically connected via a wiring layer (also called the 're-distribution wiring layer'), a reduction in the total signal wiring length and so forth in comparison with the WB method is feasible, and, accordingly, a semiconductor device with superior high frequency characteristics is produced.

What is claimed is:

1. A semiconductor device, comprising:
a semiconductor chip having a first main surface and a second main surface, the second main surface being located on a side of said semiconductor chip opposite to the first main surface, a surface area of the second main surface being larger than that of the first main surface, the semiconductor chip also having a side wall surface, the side wall surface connecting the first main surface with the second main surface, the side wall surface having an inclined portion adjacent to the first main surface;
a first pad provided on the first main surface of the semiconductor chip;
a frame-shaped member having a third main surface and a fourth main surface, the fourth main surface being located on a side of the frame-shaped member opposite to the third main surface, the frame-shaped member having an inner side wall that connects the third main surface with the fourth main surface, the frame-shaped member further having an outer side wall that connects the third main surface with the fourth main surface, the inner side wall facing the side wall surface of the semiconductor chip and surrounding the semiconductor chip;
a first wiring pattern electrically connected to the first pad, the first wiring pattern extending from the first pad, along the first main surface and the inclined portion of the side wall surface, to the third main surface; and
an external terminal provided over the third main surface, the external terminal being electrically connected to the first pad via the first wiring pattern.

2. The semiconductor device according to claim 1, further comprising a conductive portion formed in a through hole that penetrates from the third main surface to the fourth main surface, and the conductive portion being electrically connected to the first wiring pattern.

3. The semiconductor device according to claim 1, further comprising:
a post portion provided between the first wiring pattern and the external terminal; and
a sealing layer provided on the first wiring pattern and on a side surface of the post portion.

4. The semiconductor device according to claim 3, wherein an oxidation film is formed on the side surface of the post portion.

5. The semiconductor device according to claim 1, wherein the width of a part of the first wiring pattern which is located above the boundary between the first main surface and the side wall surface is wider than the remaining parts of the first wiring pattern.

6. The semiconductor device according to claim 1, wherein a plurality of chips are stacked.

7. A semiconductor device, comprising:
a semiconductor chip having a first main surface with a beveled edge portion, the semiconductor chip further having a second main surface, the second main surface being located on a side of said semiconductor chip opposite to the first main surface, the semiconductor chip also having a side surface, the side surface connecting the first main surface with the second main surface;
a first pad provided on the first main surface of the semiconductor chip;
a frame-shaped member having a third main surface and a fourth main surface, the fourth main surface being located on a side of said frame-shaped member opposite to the third main surface, the frame-shaped member having an inner side wall that connects the third main surface with the fourth main surface, the frame-shaped member further having an outer side wall that connects the third main surface with the fourth main surface, the inner side wall facing the side surface of the semiconductor chip and surrounding the side surface of the semiconductor chip;
a first wiring pattern electrically connected to the first pad, the first wiring pattern extending from the first pad, along the first main surface and the beveled edge portion, to the third main surface; and
an external terminal provided over the third main surface, the external terminal being electrically connected to the first pad via the first wiring pattern.

8. The semiconductor device according to claim 7, further comprising a conductive portion formed in a through hole that penetrates from the third main surface to the fourth main surface, and the conductive portion being electrically connected to the first wiring pattern.

9. The semiconductor device according to claim 7, further comprising:
a post portion provided between the first wiring pattern and the external terminal; and
a sealing layer provided on the first wiring pattern and on a side surface of the post portion.

10. The semiconductor device according to claim 9, wherein an oxidation film is formed on the side surface of the post portion.

11. The semiconductor device according to claim 7, wherein the width of a part of the first wiring pattern which is located above the boundary between the first main surface and the side surface is wider than the remaining parts of the first wiring pattern.

12. The semiconductor device according to claim 7, wherein a plurality of chips are stacked.

13. The semiconductor device according to claim 7, wherein the inner side wall of the frame-shaped member has a height that is less than the semiconductor chip so that at least a portion of the beveled edge portion is disposed higher than the third main surface of the frame-shaped member.

14. A semiconductor device, comprising:
a semiconductor chip having a first main surface and a second main surface, the second main surface being located on a side of said semiconductor chip opposite to the first main surface, a surface area of the second main surface being larger than that of the first main surface, the semiconductor chip also having a side wall surface, the side wall surface connecting the first main surface with the second main surface, the side wall surface having an inclined portion adjacent to the first main surface;
a first pad provided on the first main surface of the semiconductor chip;
a frame-shaped member having a third main surface and a fourth main surface, the fourth main surface being located on a side of the frame-shaped member opposite to the third main surface, the frame-shaped member having an inner side wall that connects the third main surface with the fourth main surface, the frame-shaped member further having an outer side wall that connects the third main surface with the fourth main surface, the inner side wall facing the side wall surface of the semiconductor chip and having a height that is less than the side wall surface of the semiconductor chip and surrounding the semiconductor chip so that at least a portion of the inclined portion is disposed higher than the third main surface of the frame-shaped member;
a first wiring pattern electrically connected to the first pad, the first wiring pattern extending from the first pad, along the first main surface and the inclined portion of the side wall surface, to the third main surface; and
an external terminal provided over the third main surface, the external terminal being electrically connected to the first pad via the first wiring pattern.

* * * * *